(12) United States Patent
Colucci et al.

(10) Patent No.: US 7,542,285 B2
(45) Date of Patent: Jun. 2, 2009

(54) STORAGE RACK MANAGEMENT SYSTEM AND METHOD

(75) Inventors: David A. Colucci, Stoneham, MA (US); James Rollie Johnson, Chesterfield, MO (US); Michael Falcinelli, Boxford, MA (US); Gary Ware, Newton, MA (US)

(73) Assignee: American Power Conversion Cooporation, West Kingston, RI (US)

( * ) Notice: Subject to any disclaimer, the term of this patent is extended or adjusted under 35 U.S.C. 154(b) by 106 days.

(21) Appl. No.: 11/704,489

(22) Filed: Feb. 9, 2007

(65) Prior Publication Data

US 2007/0187343 A1    Aug. 16, 2007

Related U.S. Application Data

(60) Provisional application No. 60/772,266, filed on Feb. 10, 2006.

(51) Int. Cl.
*H05K 7/20*   (2006.01)
(52) U.S. Cl. .................. 361/688; 361/681; 361/683; 165/104.33
(58) Field of Classification Search ......... 361/687–690, 361/694, 696; 165/80.3–80.5, 104.33; 62/259.2; 700/300; 454/184
See application file for complete search history.

(56) References Cited

U.S. PATENT DOCUMENTS

| 3,793,563 | A | * | 2/1974 | Brefka .................... 361/627 |
| 5,368,261 | A | * | 11/1994 | Caveney et al. ............. 248/73 |
| 5,388,032 | A | * | 2/1995 | Gill et al. .................. 700/17 |
| 6,041,851 | A | * | 3/2000 | Diebel et al. ........... 165/104.33 |
| 6,554,697 | B1 | * | 4/2003 | Koplin .................... 454/184 |
| 6,560,106 | B2 | * | 5/2003 | Ivey et al. ................. 361/695 |
| 6,611,432 | B2 | * | 8/2003 | Blood ....................... 361/724 |
| 6,714,977 | B1 | | 3/2004 | Fowler et al. |
| 6,748,458 | B2 | * | 6/2004 | Andrewartha et al. .......... 710/2 |
| 6,776,707 | B2 | * | 8/2004 | Koplin .................... 454/184 |
| 6,778,381 | B1 | * | 8/2004 | Bolognia et al. ............ 361/681 |
| 6,807,054 | B1 | * | 10/2004 | Waller et al. ................ 361/683 |
| 6,967,283 | B2 | | 11/2005 | Rasmussen et al. |
| 7,365,973 | B2 | * | 4/2008 | Rasmussen et al. ......... 361/694 |
| 7,405,926 | B2 | * | 7/2008 | Wu et al. ................... 361/681 |
| 2004/0240514 | A1 | * | 12/2004 | Bash et al. .................. 374/109 |

OTHER PUBLICATIONS

Evans, Tony, "Humidification Strategies for Data Centers and Network Rooms", American Power Conversion, White Paper 58, Rev. 2004-0, 2004.*

* cited by examiner

*Primary Examiner*—Michael V Datskovskiy
(74) *Attorney, Agent, or Firm*—Lowrie, Lando & Anastasi, LLP

(57) ABSTRACT

An equipment storage rack includes a housing defining an interior region. The housing has an exterior. At least one piece of electronic equipment is supported by the housing within the interior region. A management system is adapted to monitor and display conditions of the equipment storage rack. In a certain configuration, the management system includes a controller unit mounted within the interior region of the housing, a display unit coupled to the controller unit and mounted on the exterior of the housing, and at least one monitoring device, coupled with the controller unit, to monitor at least one parameter of the equipment storage rack. Methods of controlling an equipment storage rack are further disclosed.

29 Claims, 30 Drawing Sheets

STORAGE RACK MANAGEMENT SYSTEM AND METHOD

RELATED APPLICATIONS

This application claims priority under 35 U.S.C. § 119(e) to U.S. Provisional Application Ser. No. 60/772,266, entitled "STORAGE RACK MANAGEMENT SYSTEM AND METHOD," filed on Feb. 10, 2006, which is herein incorporated by reference in its entirety.

BACKGROUND OF THE INVENTION

1. Field of the Invention

The present invention relates to racks and enclosures, and more particularly to racks and enclosures used to house data processing, networking and telecommunications equipment.

2. Discussion of Related Art

Equipment enclosures or racks for housing electronic equipment, such as data processing, networking and telecommunications equipment have been used for many years. Such racks are used to contain and to arrange the equipment in small wiring closets as well as equipment rooms and large data centers. In certain embodiments, an equipment storage rack can be an open configuration and can be housed within a rack enclosure, although the enclosure may be included when referring to a rack.

Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry-standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard.

Management systems have been developed to manage the power distribution and cooling systems of data centers containing racks. One such management system is known as the InfraStruXure™ ("ISX") manager offered by American Power Conversion Corporation of West Kingston, R.I., the assignee of the present invention, which is particularly designed to control the operation of large data centers.

SUMMARY OF THE INVENTION

One aspect of the invention is directed to an equipment storage rack comprising housing defining an interior region. The housing has an exterior. At least one piece of electronic equipment is supported by the housing within the interior region. A management system is adapted to monitor and display conditions of the equipment storage rack. In a certain embodiment, the management system comprises a controller unit mounted within the interior region of the housing, a display unit coupled to the controller unit and mounted on the exterior of the housing, and at least one monitoring device, coupled with the controller unit, to monitor at least one parameter of the equipment storage rack.

Embodiments of the storage rack may be directed to providing the at least one monitoring device with an environmental sensor mounted on the housing of the equipment storage rack. The environmental sensor includes a temperature sensor. The equipment storage rack management system further comprises an air conditioning system coupled to the controller unit. The controller unit is configured to control the operation of the air conditioning system based on information obtained by the temperature sensor. A sensor mount is configured to be secured to the housing of the equipment storage rack and one of a snap-in clip and a zip-tie to attach the environmental sensor to the sensor mount. The environmental sensor includes a cable to connect the environmental sensor to the controller unit. The management system further comprises a cable mount configured to be secured to the housing of the equipment storage rack and one of a snap-in clip and a zip-tie to attach the cable to the cable mount. A power device is connected to the at least one piece of electronic equipment, and wherein the at least one monitoring device is connected to the power device. The housing further comprises a door to provide access to the interior region of the housing, and wherein the display unit is configured to mount on the door of the equipment storage rack. The display unit is of two-part construction, with a first part of the display unit being configured to be positioned on an outside of the door and a second part of the display unit being positioned on an inside of the door, the first and second parts being secured to one another with the door being disposed between the first and second parts. A cable configured to connect the controller unit to a second controller unit of a second equipment storage rack. A beacon, coupled to the controller unit and mounted on the housing of the equipment storage rack, to provide an alarm when the at least one monitoring device detects a predetermined event. The equipment storage rack may be further configured to communicate with a network management system. The controller unit comprises a casing having mounting tabs configured to secure the controller unit to the housing of the equipment storage rack within the interior region of the housing of the equipment storage rack. The housing is configured as a standard nineteen inch rack.

Another aspect of the invention includes a kit comprising a controller unit configured to be mounted within an equipment storage rack, a display unit configured to be mounted on the equipment storage rack and a cable to provide communication between the controller unit and the display unit.

Embodiments of the invention may include at least one monitoring device configured to monitor at least one parameter of the equipment storage rack and a cable to provide communication between the at least one monitoring device and the controller unit. The at least one monitoring device includes at least one environmental sensor. The at least one monitoring device is connected to a power device. The display unit is of two-part construction. Another cable further provides communication between the controller unit and a second controller unit of a second equipment storage rack. A beacon may be configured to be coupled to the controller unit and mounted on the housing of the equipment storage rack by another cable to provide an alarm when the at least one monitoring device detects a predetermined event. The controller unit is configured to communicate with a network management system. The controller unit comprises a casing having mounting tabs configured to secure the controller unit to the housing of the equipment storage rack within an interior region of the housing of the equipment storage rack. A cooling system is configured to be coupled to the controller unit by another cable.

A further aspect of the invention is directed to a method of controlling an equipment storage rack of the type comprising at least one piece of electronic equipment. In particular, the method comprises: mounting a controller unit on the equipment storage rack; mounting a display unit on the equipment storage rack; mounting at least one monitoring device configured to monitor at least one parameter of the equipment storage rack; and connecting the controller unit to the display unit and the at least one monitoring device.

Embodiments of the method may include connecting the controller unit with an uninterrupted power supply of the equipment storage rack. The at least one monitoring device includes an environmental sensor. The environmental sensor includes one of a temperature sensor and a combination temperature and humidity sensor. The method further comprises connecting a cooling system to the controller unit. The controller unit is configured to control the operation of the cooling system based on information obtained by the temperature sensor. The method further comprises mounting the display unit on an exterior of the housing of the equipment storage rack. The display unit is of two-part construction, and wherein mounting the display unit comprises placing a first part of the two-part display unit on the exterior of the housing of the equipment storage rack and securing the first part with a second part of the display unit from the interior region of the equipment storage rack. Mounting the at least one monitoring device includes securing a sensor mount to the housing of the equipment storage rack and attaching the at least one monitoring device to the sensor mount with one of a snap-in clip and a zip-tie. Connecting the controller unit to the at least one monitoring device includes employing a cable, and further comprises securing a cable mount to the housing of the equipment storage rack and attaching the cable to the cable mount with a zip-tie.

The present invention will be more fully understood after a review of the following figures, detailed description and claims.

BRIEF DESCRIPTION OF THE DRAWINGS

For a better understanding of the present invention, reference is made to the figures which are incorporated herein by reference and in which.

DETAILED DESCRIPTION OF THE PREFERRED EMBODIMENTS

Figure 1:
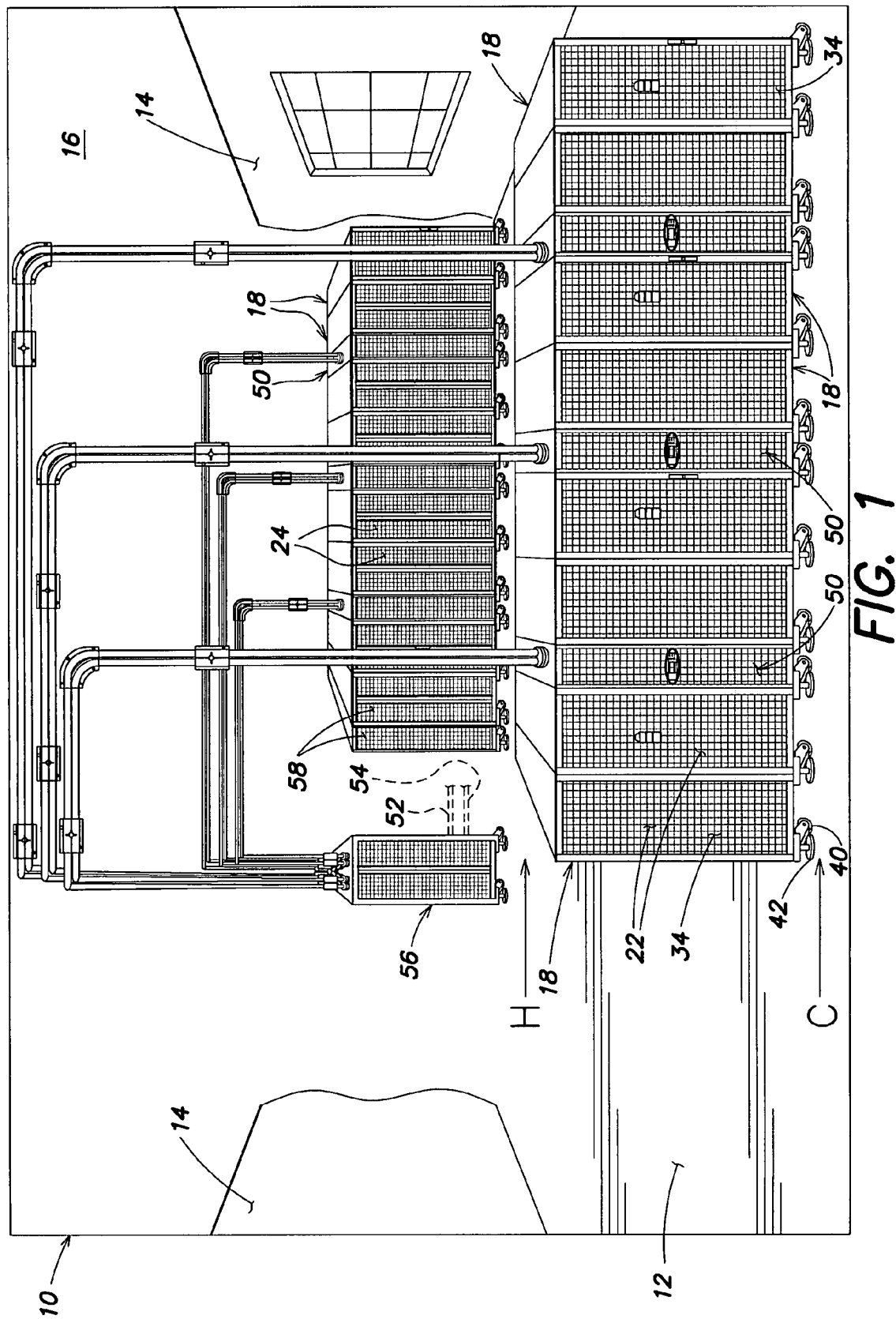
FIG. 1 is a perspective view of a portion of a data center.

For the purposes of illustration only, and not to limit the generality, the present invention will now be described in detail with reference to the accompanying figures. This invention is not limited in its application to the details of construction and the arrangement of components set forth in the following description or illustrated in the drawings. The invention is capable of other embodiments and of being practiced or being carried out in various ways. Also the phraseology and terminology used herein is for the purpose of description and should not be regarded as limiting. The use of "including," "comprising," "having," "containing" "involving," and variations thereof herein, is meant to encompass the items listed thereafter and equivalents thereof as well as additional items.

Turning now to the drawings, and more particularly to FIG. 1, there is shown a portion of a typical data center, generally indicated at 10. As shown, the data center 10 includes a room defined by a floor 12, walls, each indicated at 14, and a ceiling 16. As discussed above, a data center 10 may be designed to house a number of equipment storage racks, each generally indicated at 18. In one embodiment, each equipment storage rack 18 may be constructed in accordance with the teachings disclosed in U.S. patent application Ser. No. 10/990,927, entitled EQUIPMENT ENCLOSURE KIT AND ASSEMBLY METHOD, filed on Nov. 17, 2004, which is owned by the assignee of the present invention and is incorporated herein by reference. Further, although not shown specifically in FIG. 1, cabling between the equipment storage racks 18 may be implemented using cable distribution troughs contained on the roofs of the racks as disclosed in U.S. Pat. No. 6,967,283, which is incorporated by reference and assigned to the assignee of the present invention. The principles of the present invention may be adapted to smaller data centers, equipment rooms, computer rooms, and even wiring closets. Specifically, the system described herein may be particularly suited for smaller applications.

Figure 2:
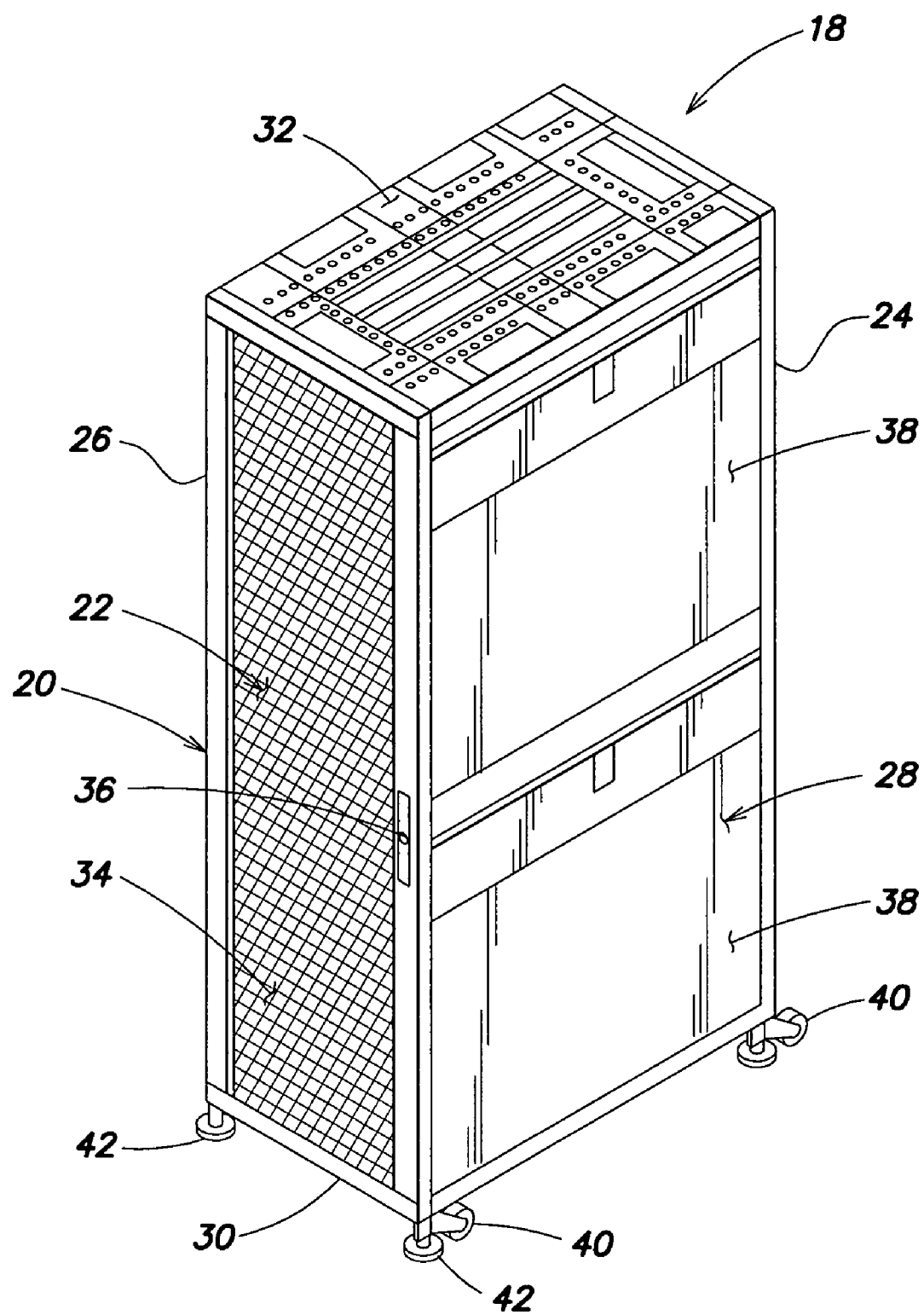
FIG. 2 is a perspective view of an equipment storage rack.

With reference to FIG. 2, the equipment storage rack 18 includes a frame or housing 20 adapted to support electronic components (not shown), such as data processing, networking and telecommunications equipment. The housing includes a front 22, back 24, sides 26, 28, bottom 30 and top 32. The front 22 of each equipment storage rack 18 includes a front door 34 so as to enable access into the interior of the equipment storage rack. Doors 58 may be further provided at the rear of the equipment storage rack to access the interior region of the storage rack from the other side. A lock 36 may be provided to prevent access into the interior of the equipment storage rack 18 and the equipment housed by the rack. The sides 26, 28 of the equipment storage rack 18 may include at least one panel 38 to enclose the interior region of the rack. FIG. 2 shows two such panels 38 configured to enclose a side of the storage rack. The back 24 of the equipment storage rack 18 may also include at least one panel or a back door (e.g., doors 58 shown in FIG. 1) to provide access to the interior of the equipment storage rack from the back of the rack. In certain embodiments, the side and back panels, as well as the front and rear doors, may be fabricated from perforated sheet metal, for example, to allow air to flow into and out of the interior region of the equipment storage rack.

The equipment storage racks 18 are modular in construction and configured to be rolled into and out of position, e.g., within a row of the data center. Casters 40 may be secured to the bottom of each equipment storage rack to enable the rack to roll along the floor 12 of the data center 10. Once positioned, leveling feet 42 may be deployed to securely ground the equipment storage rack 18 in place within the row. An example of casters 40 and leveling feet 42 employed on such an equipment storage rack 18 is disclosed in detail in U.S. patent application Ser. No. 10/990,927.

Once in position, electronic equipment may be positioned in the interior region of the equipment storage rack 18. For example, the equipment may be placed on shelving secured within the interior region of the equipment storage rack 18. Although not illustrated in FIG. 1, cables providing electrical and data communication may be provided through the top 32 of the equipment storage rack 18 either through a cover (or "roof" as described in U.S. Pat. No. 6,967,283) at the top of the equipment storage rack, with the cover having openings formed therein, or through an open top of the equipment storage rack. In such an embodiment, the cables may be strung along the roofs of the rack or be provided in the aforementioned cable distribution trough. In another embodiment, the cables may be disposed within a raised floor provided in the data center and connected to the electronic equipment through the bottom of the equipment storage rack 18. With both configurations, power and communication lines are provided to the equipment storage racks 18.

As discussed above, and with continued reference to FIG. 1, data centers 10 are typically configured with rows of equipment storage racks arranged such that cool air is drawn into the racks from a cool aisle C and warm or hot air is exhausted from the racks into a hot aisle H. For illustration purposes only, the equipment storage racks 18 are arranged in FIG. 1 in two rows with the fronts 22 of the equipment storage racks in the near row being arranged in a forward direction as viewed in FIG. 1 and the backs 24 of the equipment storage racks in the far row being arranged in a rearward direction as viewed in FIG. 1. However, as stated above, in a typical data center, there are multiple rows of equipment storage racks 18 wherein the rows may be arranged with the fronts of the equipment storage racks facing one another to define the cold aisle and with the backs of the equipment storage racks facing one another to define the hot aisle.

In order to address the heat build-up and hot spots within the data center 10 or equipment room, and to address climate control issues within the data center or room in general, a cooling system, such as a modular cooling system, may be provided. Such a modular system is described in pending U.S. patent application Ser. No. 11/335,874, entitled COOLING SYSTEM AND METHOD, filed on Jan. 19, 2006, which is owned by the assignee of the present invention and hereby is incorporated herein by reference. As shown in FIG. 1, the cooling system may include a plurality of cooling racks, each generally indicated at 50, disposed within the data center 10. As shown, the arrangement is such that there is a cooling rack 50 for every two equipment storage racks 18 provided in the data center 10. However, it should be understood that a person of ordinary skill in the art may provide more or less cooling racks 50 within the data center 10 depending on environmental conditions of the data center. Further, in some embodiments, the concentration and locations of cooling racks may be adjusted based on the locations of the hottest racks in the data center, or based on information obtained and analyzed by a data center information management system.

The data center 10, or the equipment room or wiring closet, as the case may be, may further include a coolant medium inlet 52 and a coolant medium outlet 54 adapted to deliver and return a coolant medium (e.g., water, a glycol solution or a liquid coolant, such as R134A and R410A coolants) from a suitable source, such as a chiller unit (not shown). Specifically, the coolant medium inlet 52 is adapted to deliver chilled or cooled coolant to the data center 10, whereas the coolant medium outlet 54 is adapted to exhaust heated coolant from the data center. The inlet 52 and outlet 54 are in fluid communication with a manifold or distribution box, generally indicated at 56 in FIG. 1. The distribution box 56 may include an enclosure positioned in the data center 10, which may be constructed similarly to the equipment storage rack 18. The distribution box 56 is designed to distribute chilled coolant to and to accept heated coolant from each cooling rack 50. In certain embodiments, the distribution box 56 may be conveniently located within the data center 10, and in other embodiments, may be located outside the data center. FIG. 1 illustrates the distribution box 56 positioned near the equipment storage racks 18 and the cooling racks 50 of the data center 10. As shown, the distribution box 56 is in fluid communication with the cooling racks 50 to provide chilled coolant to and exhaust heated coolant from each cooling rack.

Details of the modular cooling system and its various components and configurations may be found in pending U.S. patent application Ser. No. 11/335,874. Also, the cooling system may embody other cooling configurations, such as one of several cooling solutions offered by American Power Conversion Corporation of West Kingston, R.I., the assignee of the present invention.

In smaller data centers, equipment rooms, computer rooms or even wiring closets, the application of a system manager, such as the InfraStruXure™ manager, may not be feasible or cost-effective. With such smaller applications, it may be desirable to have a dedicated system that is designed to enable an operator to monitor and control the operation of equipment, including power protection, power generation, power distribution, environmental monitoring, cooling, access and security, and fire and smoke monitoring capabilities, for example. There are presently products that are available to monitor and control one or two of these functions. For example, a product line of uninterruptible power supplies (otherwise known as an "UPS" in the industry), such as those offered under the brand name Symmetra™ by American Power Conversion Corporation of West Kingston, R.I., the assignee of the present invention, includes a display that is capable of displaying power and environmental data for a single equipment storage rack. Additionally, systems may be provided to provide rack-to-rack communication.

Figure 3:
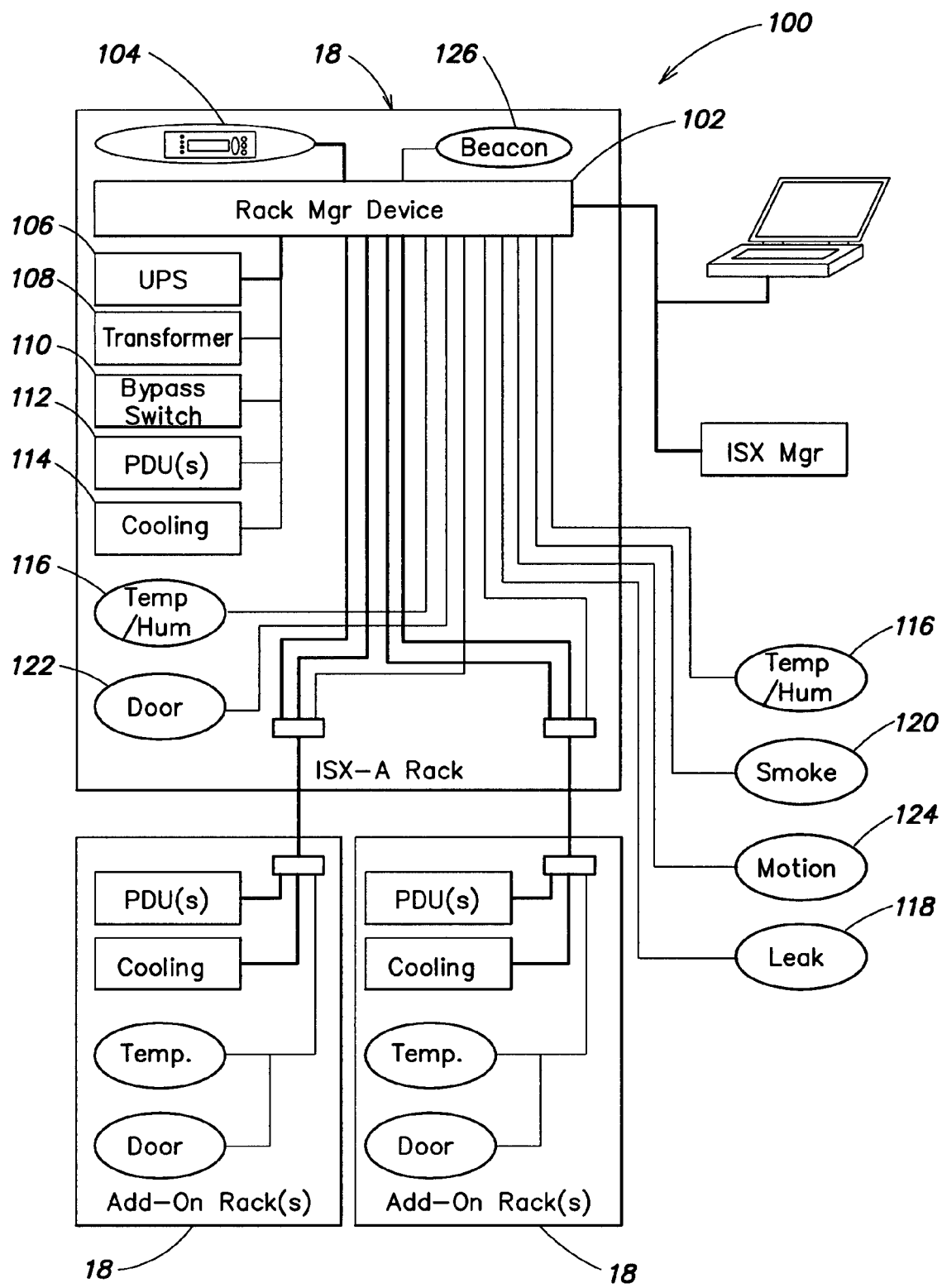
FIG. 3 is a block diagram showing certain functional aspects of an equipment storage rack management system of an embodiment of the present invention.

Turning now to FIG. 3, there is generally indicated at 100 an equipment storage rack management system of an embodiment of the present invention. The management system 100 is configured to monitor and display conditions of an equipment storage rack, such as the equipment storage rack 18 described above, and to provide additional functionality presently offered by separate, distinct products. In such an equipment storage rack, one or more pieces of electronic equipment, such as blade servers, are supported by the housing. It should be understood that the management system 100 described herein may be applied in systems having electronic equipment located outside an equipment storage rack, such as on shelves or some other suitable location within a data center, equipment room or wiring closet. As will be described in greater detail below, the management system 100 may operate independently to control the operation of the equipment storage rack, or may be configured to communicate with a higher level network manager and/or additional equipment storage racks.

In one embodiment, the management system 100 comprises a controller unit 102, which may be mounted within the interior of the housing of the equipment storage rack, and a display unit 104, which is connected to the controller unit and mounted on the housing of the equipment storage rack. On the equipment storage rack level, the controller unit (sometimes referred to as a "rack manager device" in FIG. 3) may be connected to one or more of the following devices: an uninterruptible power supply or UPS 106; a transformer 108; a bypass device 110; a power distribution unit ("PDU") 112; and cooling unit or system 114. The bypass device 110 may be configured to receive current from a power supply and to direct the current to the UPS 106, or if the UPS is inoperable or otherwise incapacitated, directly to the load. If operable, the UPS directs the current back to the bypass device, which in turn directs the current to the load. With respect to the cooling unit 114, the controller unit 102 may communicate with a cooling system, such as the cooling system 50 described above or some other cooling system, to control the cooling of air within the space, based on information obtained about the environmental conditions at or near the equipment storage rack.

The controller unit 102 may be connected to one or more monitoring devices to monitor certain parameters of the equipment storage rack. Specifically, the controller unit 102 may be connected to a sensor or multiple sensors to measure environmental conditions at or near the equipment storage rack. As shown in FIG. 3, the sensors may include temperature/humidity sensor 116 to detect or measure the temperature and humidity within the space. In certain embodiments, the sensor may be a temperature sensor, or a combination temperature and humidity sensor. In addition, the sensors may further include a leak/moisture sensor 118 to detect unwanted moisture or wetness within the space, a smoke sensor 120 to detect heat or smoke build-up within the space, a door status sensor 122 to indicate whether a door of the equipment storage rack (e.g., door 34 or doors 58 of storage rack 18 shown in FIG. 1) is in an opened or a closed position, and a motion sensor 124 to detect unwanted motion within the space. Other sensors may include vibration sensors and security-related sensors. In one embodiment, these sensors may be attached to the housing of the equipment storage rack, or to structures near the equipment storage rack. It should be understood that any number of sensors useful to monitor or measure other parameters within the space may be further provided.

In one example, the controller unit 102 may be connected to a NetBotz® monitor and appliance, which may include a camera for monitoring the rack and/or equipment room. The NetBotz monitor and appliance is offered by American Power Conversion Corporation of West Kingston, R.I., the assignee of the present invention.

The environmental sensors, e.g., temperature sensor 116, as well as the leak/moisture sensor 118 and the fire/smoke sensor 120, may be mounted on the housing of the equipment storage rack in locations where it is desirable to monitor environmental conditions in a manner described in greater detail below. In certain embodiments, the housing 20 of the equipment storage rack 18 may be configured with four doors to access the interior of the equipment storage rack. In this embodiment, two doors are mounted at the front of the equipment storage rack and two doors are mounted at the rear of the rack. The controller unit 102 may be configured to have four door sensors to monitor the status (i.e., whether the doors are closed or opened) of the four doors of the equipment storage rack. In other embodiments, such as with the equipment storage rack 18 shown in FIGS. 1 and 2, the storage rack is configured to have one front door (e.g., door 34) and two rear doors (e.g., doors 58 in FIG. 1) and may have one rear door.

Still referring to FIG. 3, the controller unit 102 may also be connected to a beacon 126, which may be mounted on the housing 50 of the equipment storage rack 18 or provided in a visible area within the data room or wiring closet, to provide an alarm upon detecting an out of tolerance condition by one or more of the monitoring devices. In one embodiment, the beacon 126 may be mounted on the top 32 or on the front 22 of the housing 20 of the equipment storage rack 18. The beacon 126 may be configured to provide a visual alarm to the operator of the data room (or a security person) when a certain event occurs. In other embodiments, the beacon 126 may include a siren or other audible device in addition to the visual alarm. In one embodiment, the management system 100 may be programmed to recognize one of four levels of events, which are major ($1^{st}$), minor ($2^{nd}$), warning ($3^{rd}$) and informational ($4^{th}$). For example, the beacon 126 may be configured to operate an alarm when a particular minor or major event occurs.

The controller unit 102 may also be connected to one or more controller units provided in add-on equipment storage racks. The add-on equipment storage racks may be configured in a manner similar to the equipment storage rack 18 described above. For example, in one embodiment, the controller units 102 may be provided in each equipment storage rack 18. With this embodiment, the controller units 102 may be configured to communicate with one another. In other embodiments, the controller units 102 may be configured to communicate with a network management system, such as the ISX manager, which is referred to above.

Figure 4:
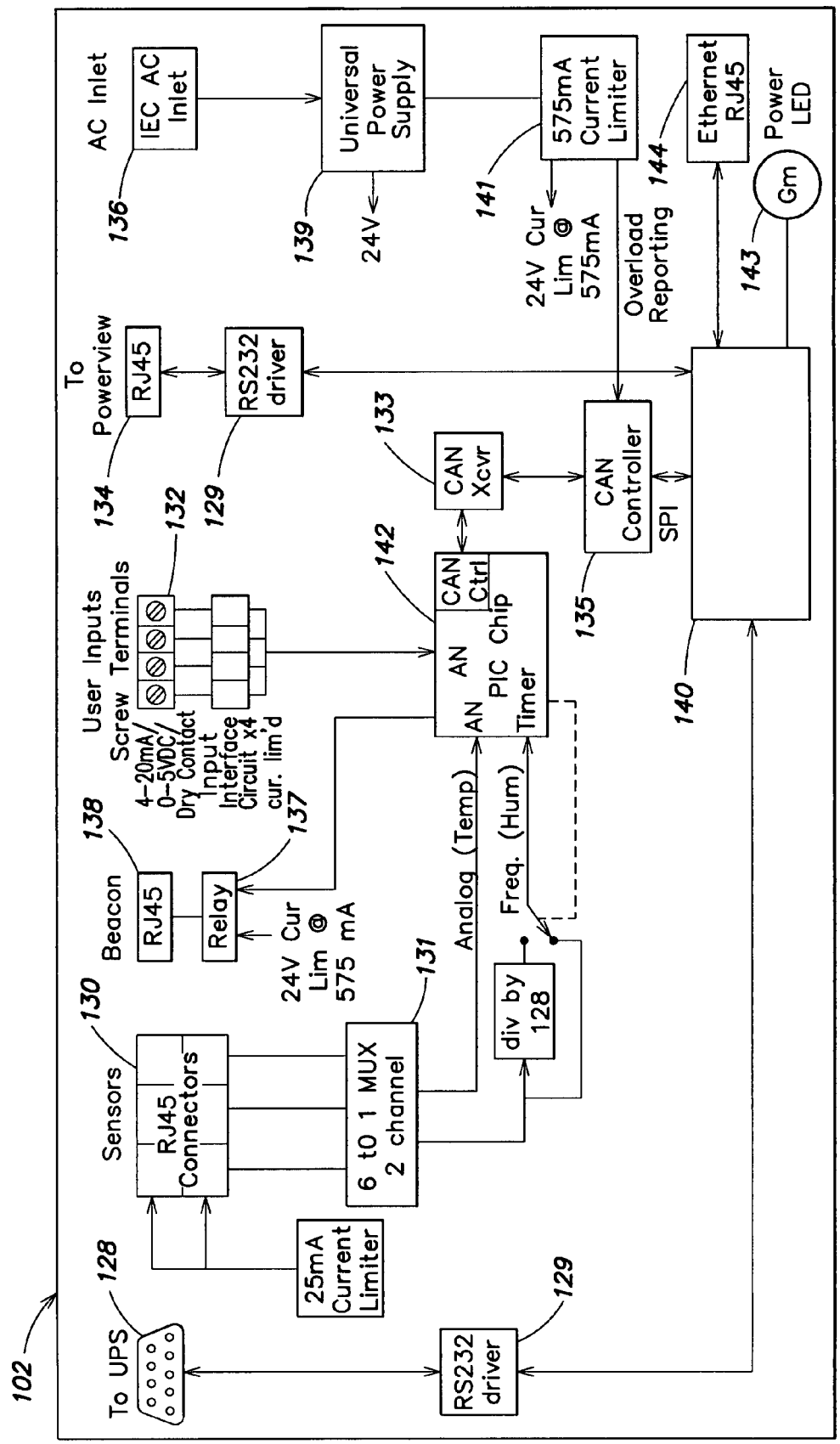
FIG. 4 is another block diagram showing hardware of a controller unit of the management system shown in FIG. 3.

Turning now to FIG. 4, there is illustrated a block diagram of the hardware provided in the controller unit 102. As shown, a connector 128 is provided to connect the controller unit 102 to the UPS 106. Sensor connectors 130 are further provided to connect the controller unit 102 to the temperature/humidity sensor 116, the smoke sensor 120, the leak/moisture sensor 118, and the motion/vibration sensor 124. The sensor connectors 130 are configured to have receptacles that receive mating plugs for the temperature/humidity sensor, the smoke sensor, the leak/moisture sensor and the motion/vibration sensor. User inputs 132 may be provided to connect the controller unit 102 to the door status sensor 122. The user inputs 132 are configured to have receptacles that receive mating plugs for the door status sensor 122. Connectors 134, 136 connect the controller unit 102 to the display unit 104 and the power supply, respectively. Lastly, a connector 138 provides connection between the controller unit 102 and the beacon 126. A processor 140, such as a 16-bit microprocessor custom designed by American Power Conversion Corporation as part no. 359-0067, is provided to control the operation of the UPS, the temperature/humidity sensor 116, the beacon 126, user inputs 132, the display unit 104 and the power supply 112. Another processor 142, designated a "PIC chip" in FIG. 4, may be provided to control the operation of the beacon 126 and the user inputs 132. A further connector 144 may be provided to connect the controller unit 102 to an external network, such as the network controlled by the network management system described above.

In one embodiment, the connectors 130, 134 and 138 are RJ45 connectors and the user inputs are screw terminals. Still referring to FIG. 4, a driver 129 is disposed between the processor 140 and the connectors 128, 134. In addition, the connectors 130 communicate with the PIC chip processor 142 by means of a 2-channel, 6 to 1 MUX protocol device 131 to deliver the temperature reading and the humidity reading to the PIC chip. A trans-receiver 133 and a CAN controller 135 are disposed between the PIC chip processor 142 and the processor 140. A relay 137 is disposed between the connector 138 and the PIC chip processor 142. The AC inlet by connector 136 is coupled to a universal power supply 139 and a 575 mA current limiter 141, which are adapted to deliver power to the CAN controller 135 at 24 volts. An LED 143 is provided to inform the operator of the power status of the controller unit 102.

In a certain embodiment, humidity may be encoded as a frequency that does not suffer degradation of accuracy over long wires and is more readily measured over a wide dynamic range by digital components, such as microprocessors. One benefit to this approach is that the sensing device cannot tolerate direct current, so using a device as part of an oscillator circuit satisfies this restriction.

Figure 5:
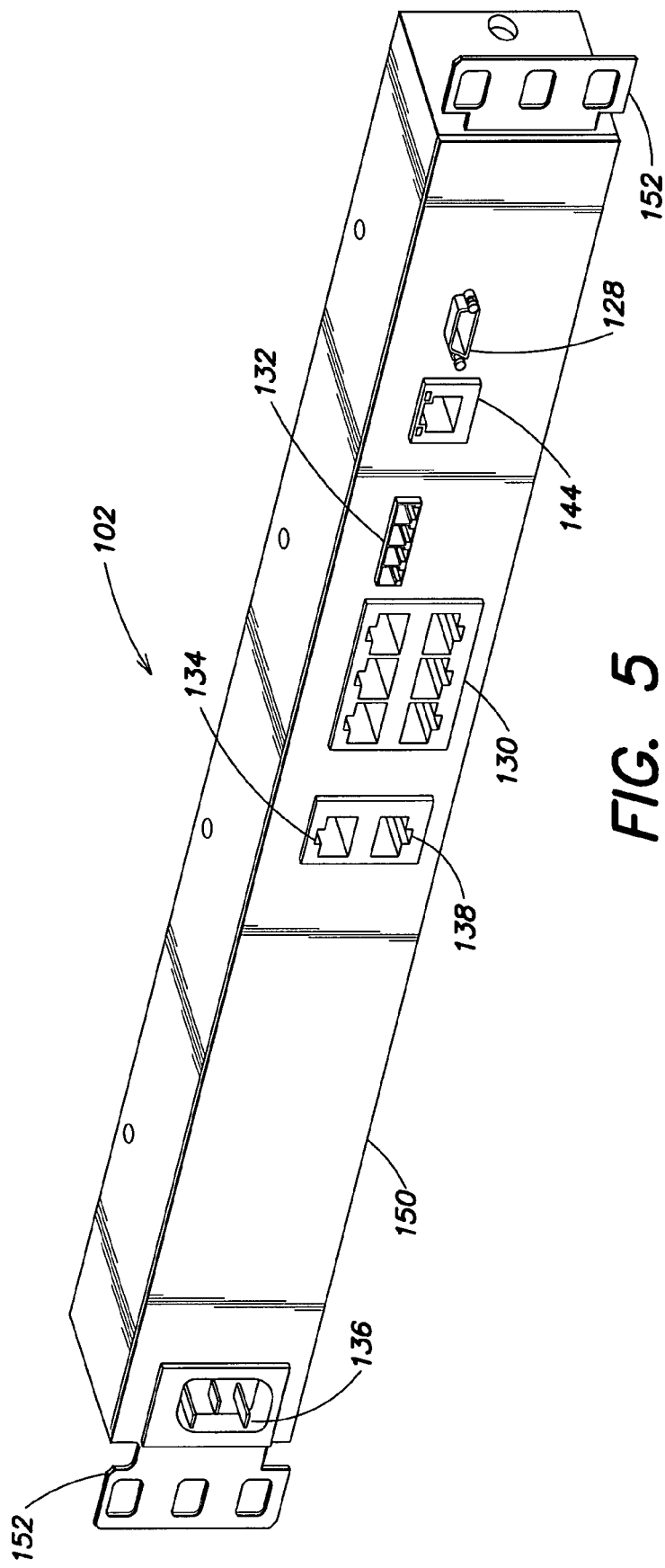
FIG. 5 is a front perspective view of the controller unit.
Figure 6:
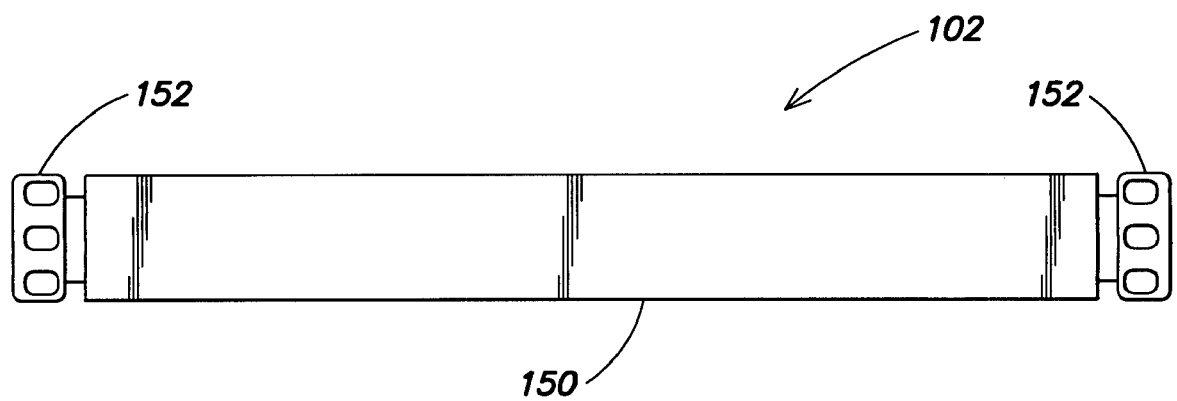
FIG. 6 is a rear elevational view of the controller unit shown in FIG. 5.
Figure 7:
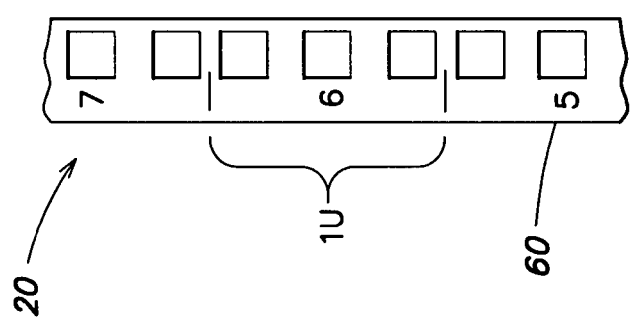
FIG. 7 is a front elevational view of a vertical rail of the equipment storage rack shown in FIG. 2.

Referring to FIGS. 5 and 6, the controller unit 102 comprises a casing 150 that is configured to be mounted on the housing 20 of the equipment storage rack 18, for example. Specifically, in one embodiment, the controller unit 102 may be adapted to be mounted within the interior region and at the back of the equipment storage rack. The casing 150 of the controller unit 102 is narrow in width so that it occupies a "1U" space within the interior region of the rack. Reference may be made to FIG. 7, which illustrates a 1U space on a vertical rail 60 of the housing 20 of storage rack 18. The casing of the controller unit 102 is approximately seventeen inches in length. As shown, the controller unit 102 has receptacles for the power supply 136, the display 134, the beacon 138, the sensors 130, the user inputs 132 and the UPS 128. As shown in FIG. 5, these receptacles are referenced to correspond to connectors 136, 134, 138, 130, 132 and 128, respectively, depicted in FIG. 4. As shown in FIGS. 5 and 6, the controller unit 102 includes a pair of tabs, each indicated at 152, that are provided on the back of the controller housing 150 for mounting the controller unit on the housing of the equipment storage rack (e.g., housing 20 of storage rack 18) by suitable fasteners, such as screw fasteners.

Figure 8:
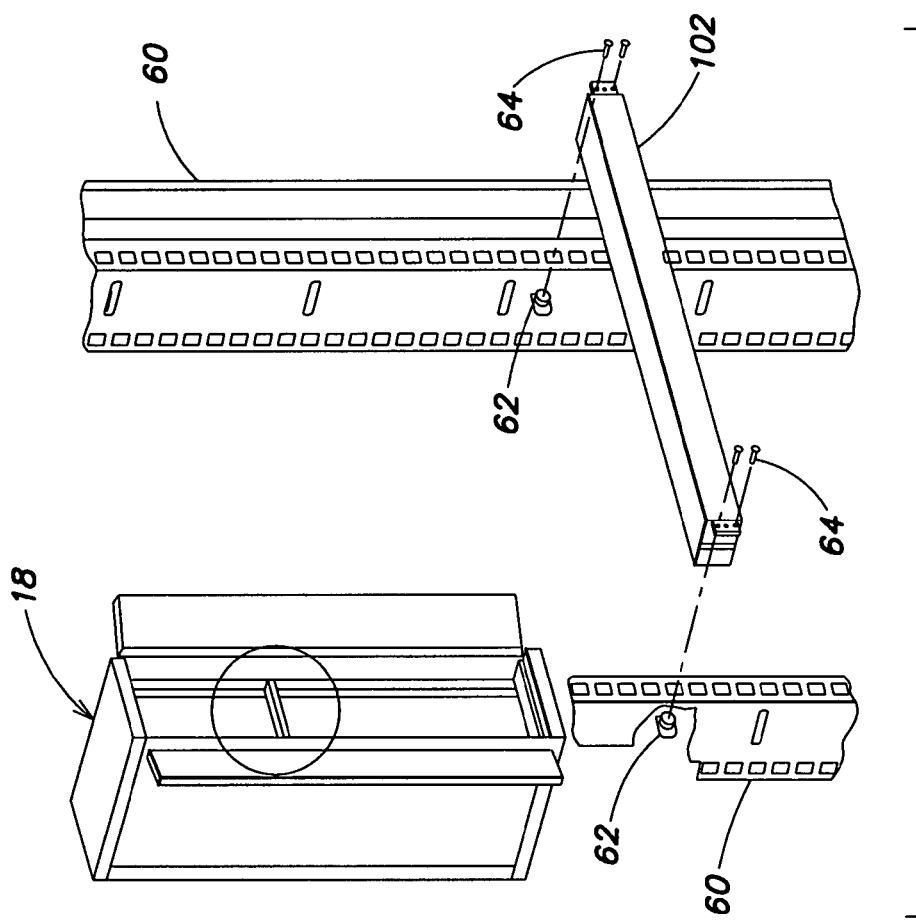
FIG. 8 is an enlarged, perspective view of the controller unit being mounted on the equipment storage rack.

The controller unit 102 may be installed in the front or the rear of the equipment storage rack (e.g., rack 18) by using either a rack-mounted option, which uses 1U of rack space, or a tooless peg-mounted option, which does not use any U-spaces. FIG. 8 illustrates the controller unit 102 shown in FIGS. 5 and 6 mounted at the rear of the storage rack 18. With the rack-mounted option, which is shown in FIG. 8, the tabs 152 are used to secure the casing 150 of the controller unit 102 to vertical rails (e.g., rail 60 of FIG. 7) of the housing 20 of the storage rack 18 with suitable fasteners, such as screw fasteners. The controller unit 102 may be positioned at any suitable location is chosen at the rear or front of the storage rack, within the interior region of the storage rack. Reference may be made to marks or numbers etched on the vertical rails of the housing of the storage rack (see FIG. 7) to identify a vertical elevation to mount the controller unit 102. These numbers are provided to assist the installer in mounting the controller unit 102 in a level position. Caged nuts 62 are provided within the vertical rails to secure the tabs 152 to the rails with four mounting screws, each indicated at 64, once the mounting holes (not designated) of the tabs are aligned with the caged nuts 62 at a desired elevation.

Figure 9:
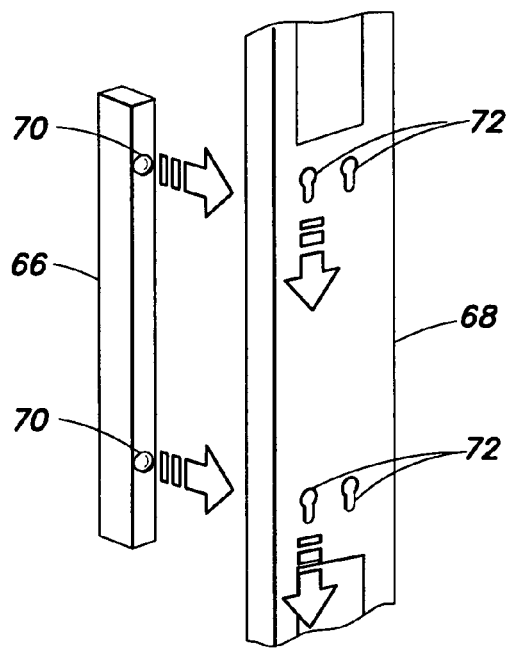
FIG. 9 is an enlarged, perspective view of a mounting peg of an embodiment of the invention used to mount the controller unit on the equipment storage rack.

With the peg-mounted option, which is partially illustrated in FIG. 9, mounting pegs are provided to secure the controller unit 102 to a pair of vertical mounting channels secured to the housing 20 of the equipment storage rack 18. FIG. 9 illustrates only one such mounting peg 66 and mounting channel 68. The vertical rail 60 shown in FIGS. 7 and 8 may be used in place of the mounting channel 68. As shown, the mounting peg 66 includes a pair of projections, each indicated at 70, that are configured to be inserted into a mating pair of openings, each indicated at 72, formed in the mounting channel 68. The projections 70 are sized so that enlarged ends of the projections fit within enlarged portions of the openings 72. The mounting peg 66 is secured in place by sliding it downward until it locks into position. The mounting pegs 66 may be suitably secured to the tabs 152 of the controller unit 102 to mount the controller unit within the equipment storage rack.

Figure 10:
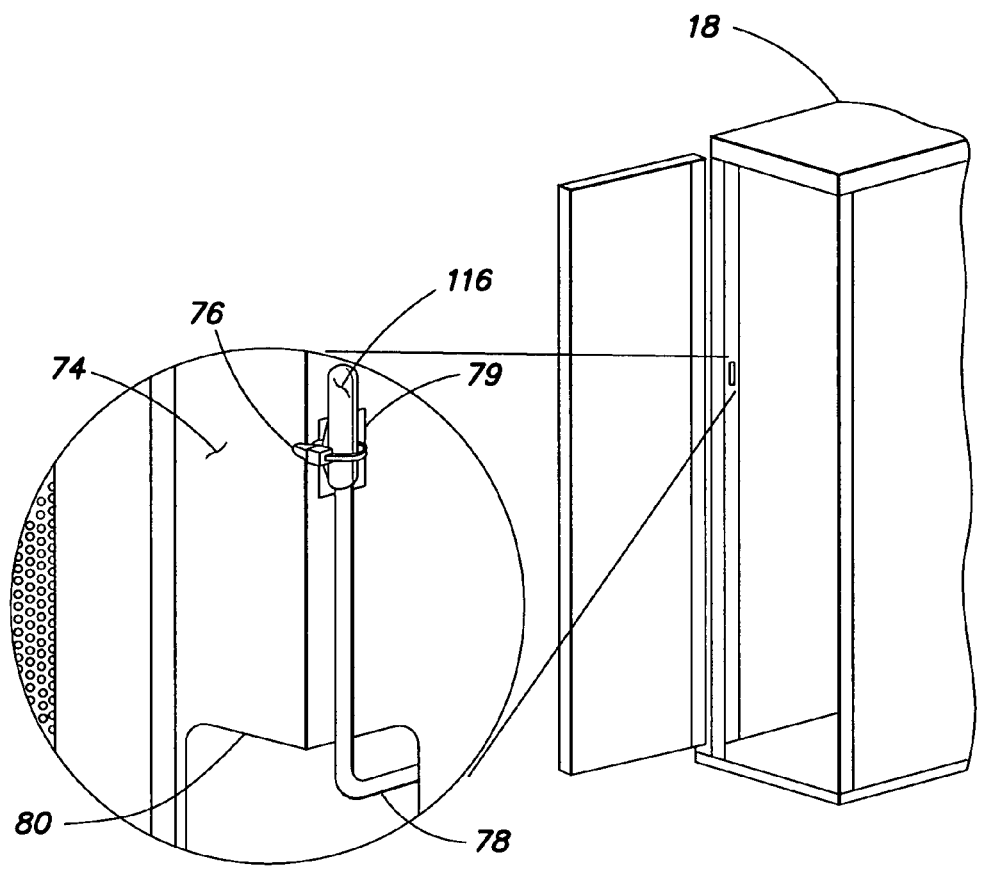
FIG. 10 is an enlarged, perspective view of a temperature sensor mounted on the equipment storage rack.

A temperature or a temperature/humidity sensor 116 (hereinafter referred to as a "temperature sensor") may be installed by selecting a location within the equipment storage rack 18 that represents the air requiring monitoring. The temperature sensor 116 should not be placed in locations that may affect the sensor's readings, such as near windows, room entrances, air ducts, heat sources or in direct sunlight. When mounting the temperature sensor 116 onto a vertical rail, such as rail 74 illustrated in FIG. 10, a location along the length of the rail is selected. In one embodiment, the temperature sensor 116 is secured to the rail 74 with a sensor mount 76, which is attached to the rail by peeling a protective backing (not shown) off of an adhesive side of a sensor mount and pressing the adhesive side against the vertical rail. As shown, the temperature sensor 116 is attached to a cable 78, which is secured to the sensor mount 76 by a zip-tie 79 by means of an opening (not shown) formed in the sensor mount. After securing the temperature sensor 116 to the sensor mount 76, the zip-tie 79 may be trimmed to create a neat appearance. The cable 78 may then be directed an opening 80 formed in the rail 74. Once within the rail 74, the cable 78 is routed back to the controller unit 102 and plugged into one of the sensor connectors 130.

Figure 11:
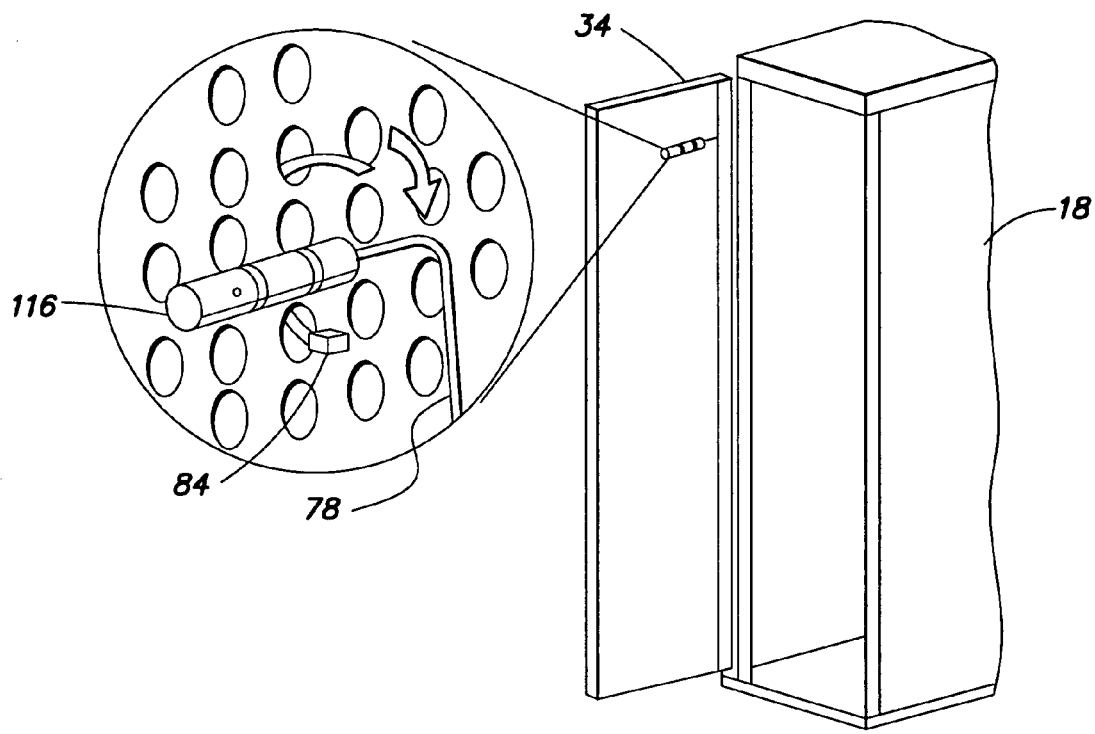
FIG. 11 is an enlarged, perspective view of a temperature sensor mounted on the equipment storage rack in accordance with another embodiment of the invention.
Figure 12:
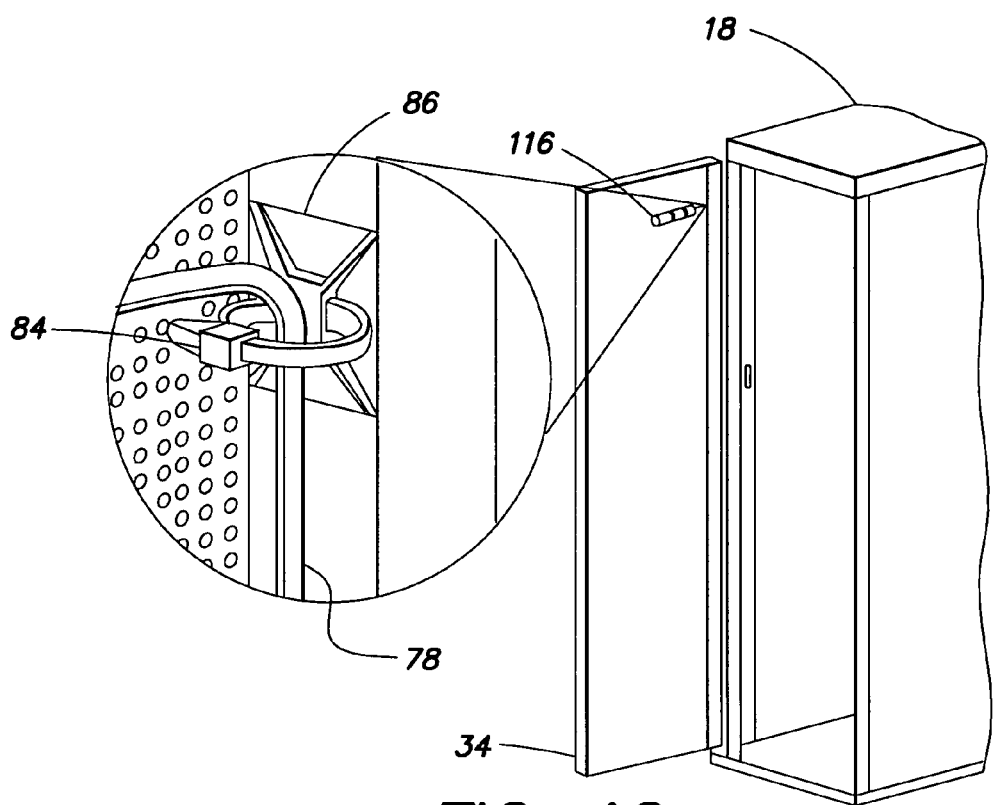
FIGS. 12, 12A and 12B are enlarged, perspective views of cable mounts of embodiments of the invention used to secure a cable to the equipment storage rack.
Figure 12A:
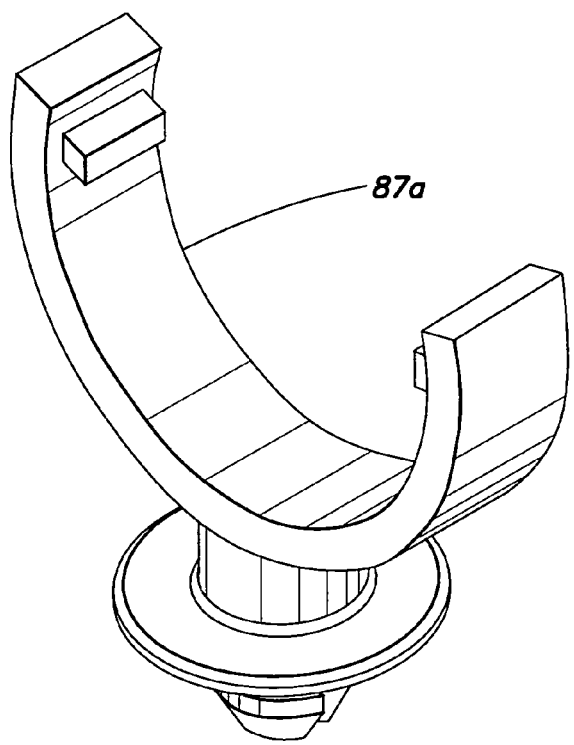
Figure 12B:
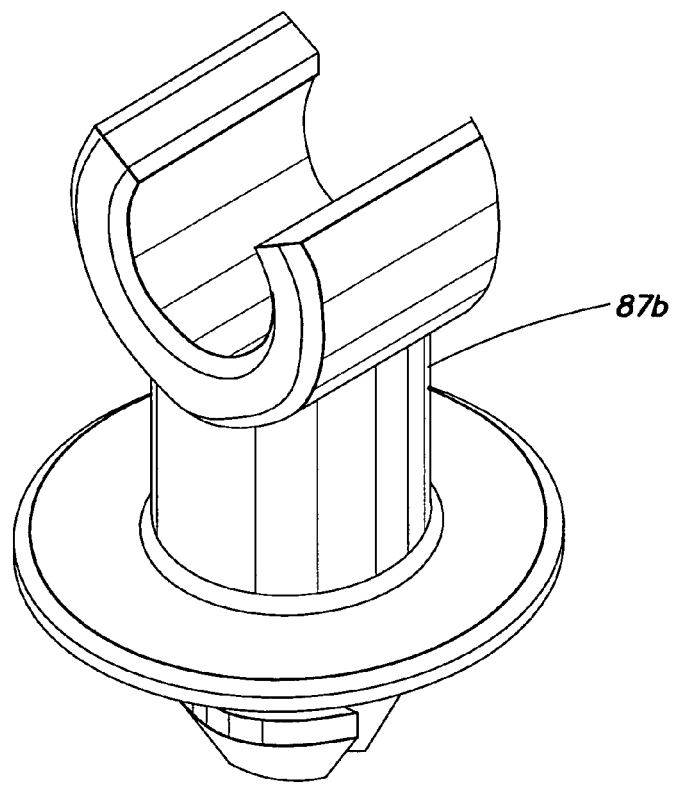

With reference to FIGS. 11 and 12, and first to FIG. 11, in another embodiment, a temperature sensor 116 may be secured to a door 34 of the equipment storage rack 18. In this embodiment, the temperature sensor 116 is secured to an inside surface of the door at or near the top of the door. The bottom of the door may not accurately represent the temperature of the air within the volume of space. In one embodiment, the temperature sensor 116 may be secured to the door 34 by using a zip-tie 84 (which may be identical to zip-tie 79 shown in FIG. 10) that is threaded through openings formed in the door. The zip-tie 84, once tightened, may be trimmed to create a neat appearance. The cable 78, which is secured to the temperature sensor 116, is routed in a horizontal direction toward a door frame so that the cable 78 is generally even with the temperature sensor. A cable mount 86 is provided to secure the cable 78 to the door frame in the manner shown in FIG. 12. As shown, the cable mount 86 is attached by peeling a protective backing (not shown) off of an adhesive side of the cable mount, and pressing the cable mount firmly against an inside surface of the door frame. The cable 78 is then secured to the cable mount by using another zip-tie 84, which is threaded through an opening (not designated) provided in the cable mount. Additional cable mounts 86 may be provided to secure the cable 78 to the door frame or to other support members of the housing 20 of the equipment storage rack 18. The end of the cable 78 may be attached to the controller unit 102 in the manner described above. Another embodiment shown in FIGS. 12A and 12B, may include plastic clips 87a, 87b, respectively, which may be provided by American Power Conversion Corporation of West Kingston, R.I. The clips 87a, 87b may be configured to snap fit into holes provided within the door. As shown, clip 87a is relatively larger than clip 87b and includes features at the tips of the clip to lock into small recesses in the sides of the temperature/humidity sensor housing. Clip 87b may be used to hold the temperature-only sensor by holding the wire close to the body of the sensor. Such a configuration increases the thermal resistance between the door and the sensor element such that a reading better reflects the temperature of the air rather than the temperature of the door. The other sensors may be installed within the equipment storage rack 18 using similar techniques employed to mount the temperature sensors 116 within the storage rack.

A UPS cable (not shown) may be provided to connect the UPS to the controller unit. In one embodiment, the UPS cable may be provided by American Power Conversion Corporation of West Kingston, R.I. under part no. 940-0024C. One end of the UPS cable is connected to connection 128 of the controller unit 102 and the other end of the cable is connected to a port of the UPS.

Figure 13:
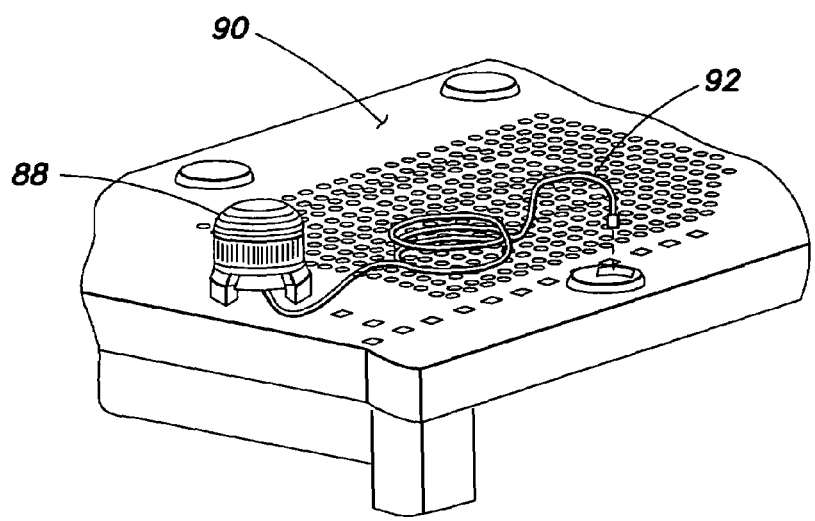
FIG. 13 is a perspective view of a beacon of an embodiment of the invention mounted on a top of the equipment storage rack.

Turning now to FIG. 13, a beacon alarm 88 may be installed in a visible position on either a roof 90 of the equipment storage rack 18 or inside the storage rack. When installing the beacon alarm 88 on the roof 90 of the storage rack 18, a cable 92 is routed through any one of several openings provided in the roof. The beacon alarm 88 may be secured to the roof 90 by fasteners (not shown) or rest on the roof. An end of the cable 92 may be plugged into the connector 138 of the controller unit 102. It should be noted that the beacon alarm 88 may be mounted on the front 22 of the housing 20 of the equipment storage rack 18 using any suitable mounting technique. In one embodiment, the beacon alarm 88 may provide a visual indication of a certain event requiring immediate attention, for example. In another embodiment, the beacon alarm 88 may provide a visual and aural indicator of such an event.

Figure 15:
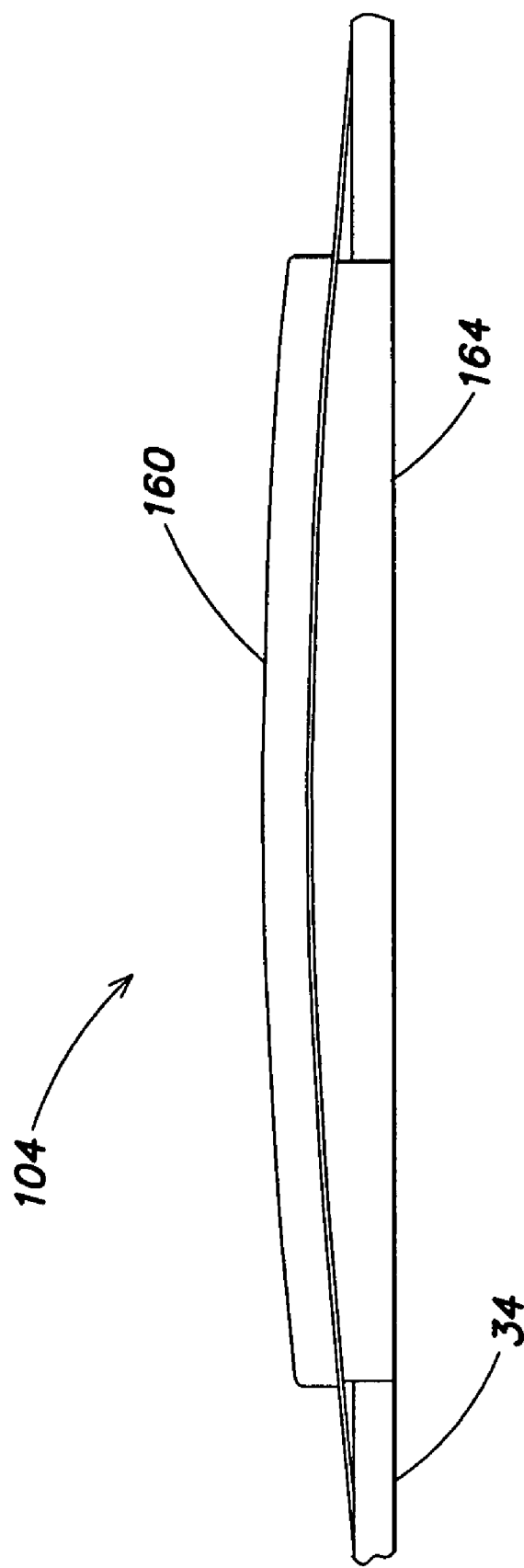
FIG. 15 is a top plan view of the display unit.
Figure 16:
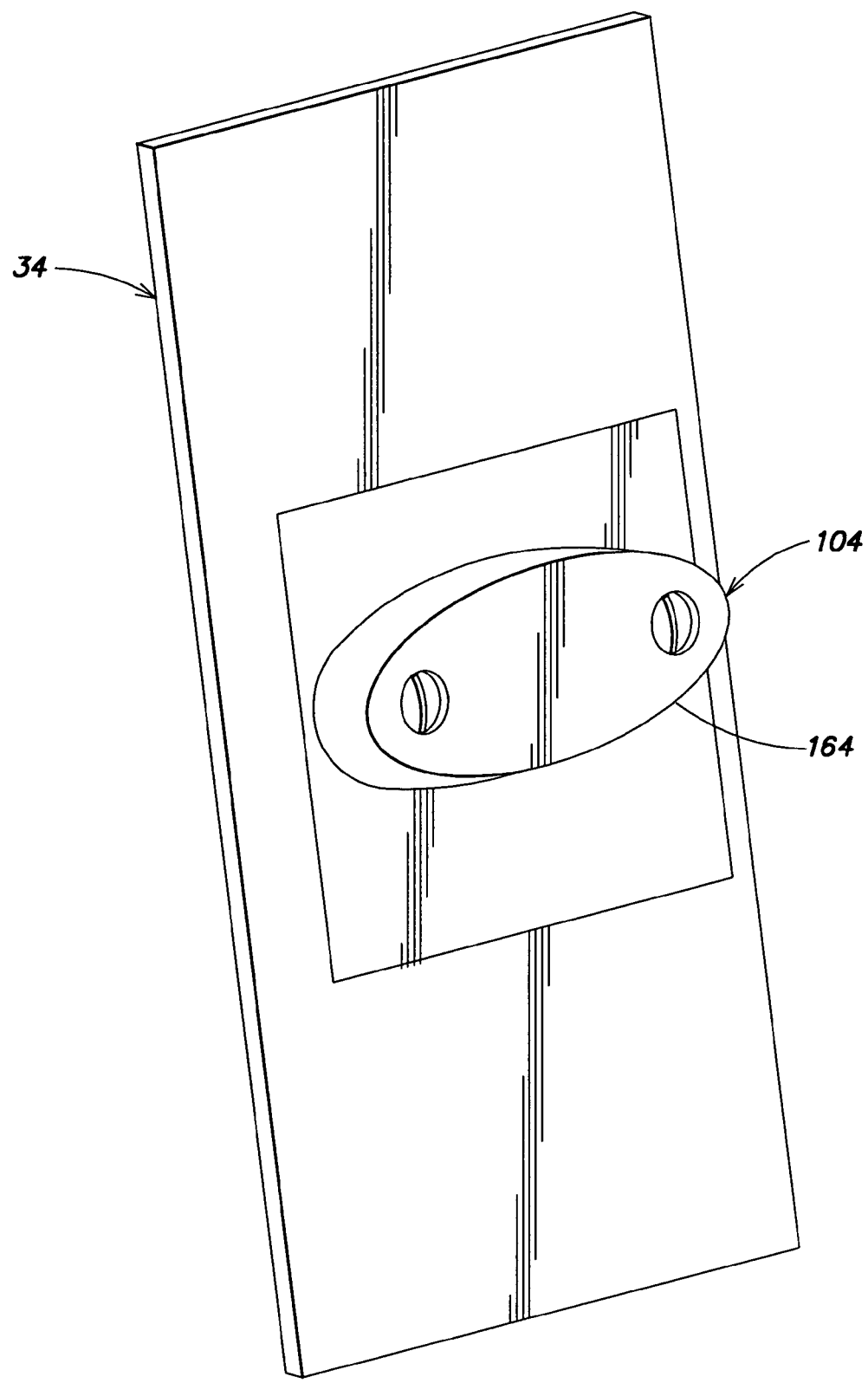
FIG. 16 is a rear perspective view of the display unit.
Figure 17:
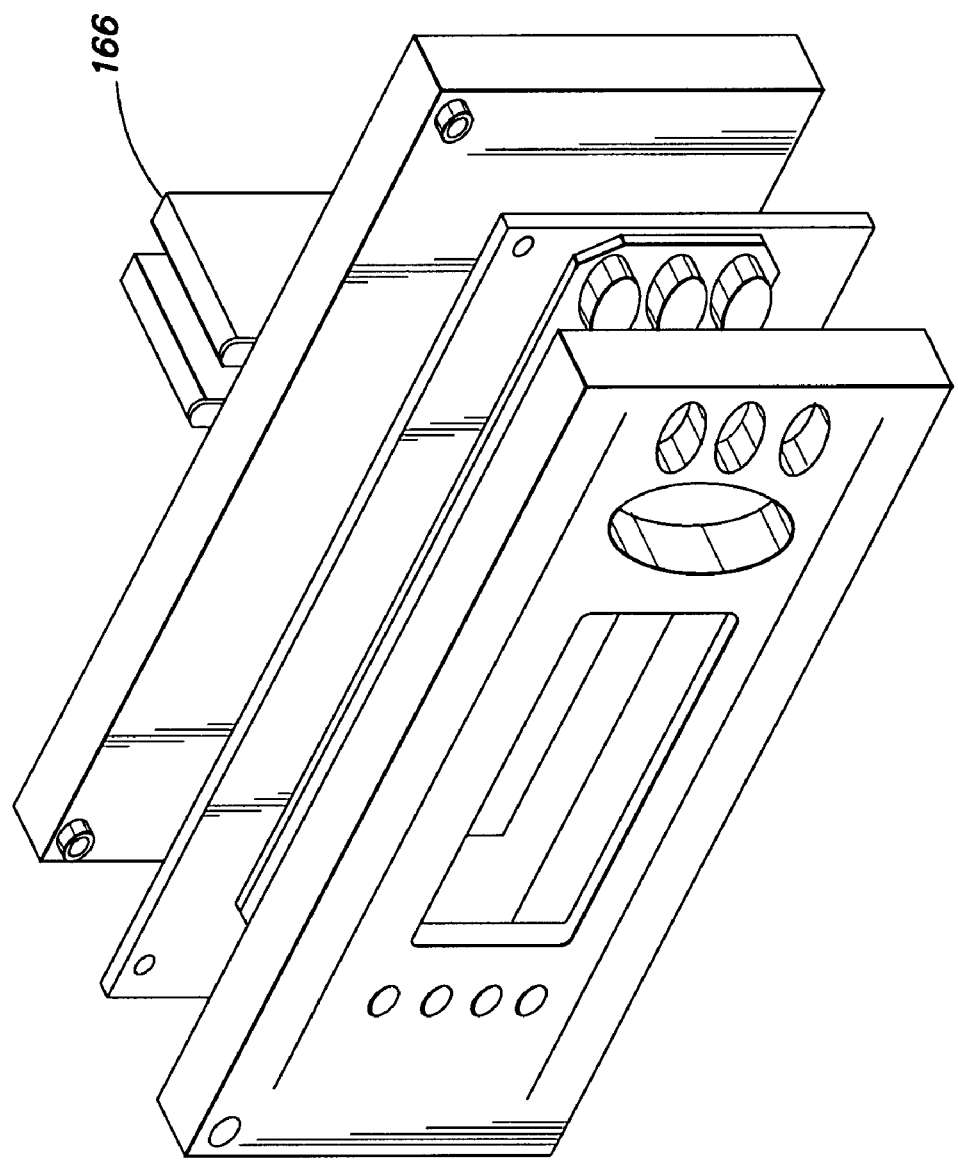
FIG. 17 is an exploded perspective view of a display panel assembly of the display unit.
Figure 18A:
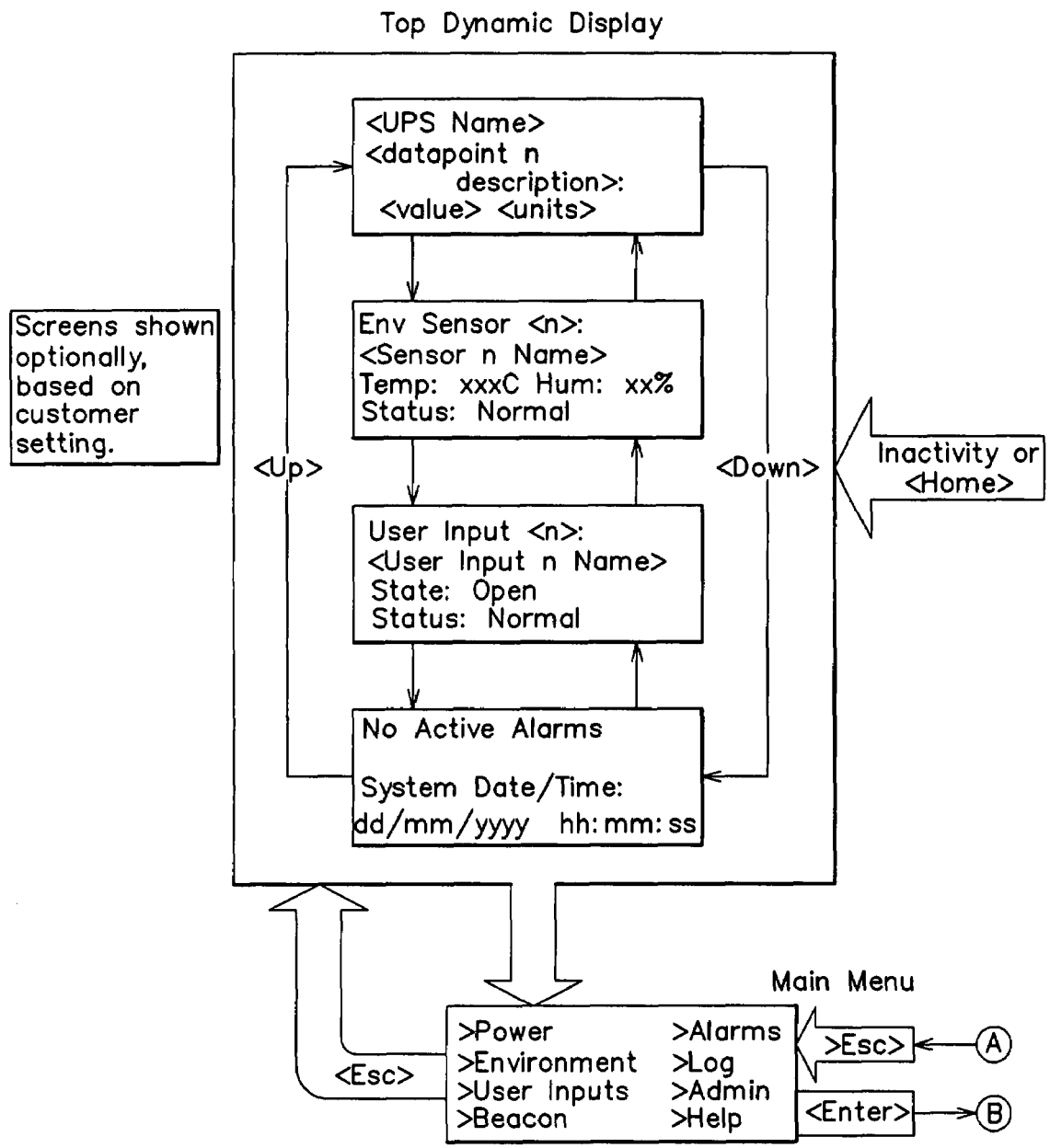
FIGS. 18A, 18B, 19A, 19B, 20-24, 25A, 25B, 26A, 26B, 27, 28A and 28B are functional block diagrams of the menu options provided on the display unit of the management system.
Figure 18B:
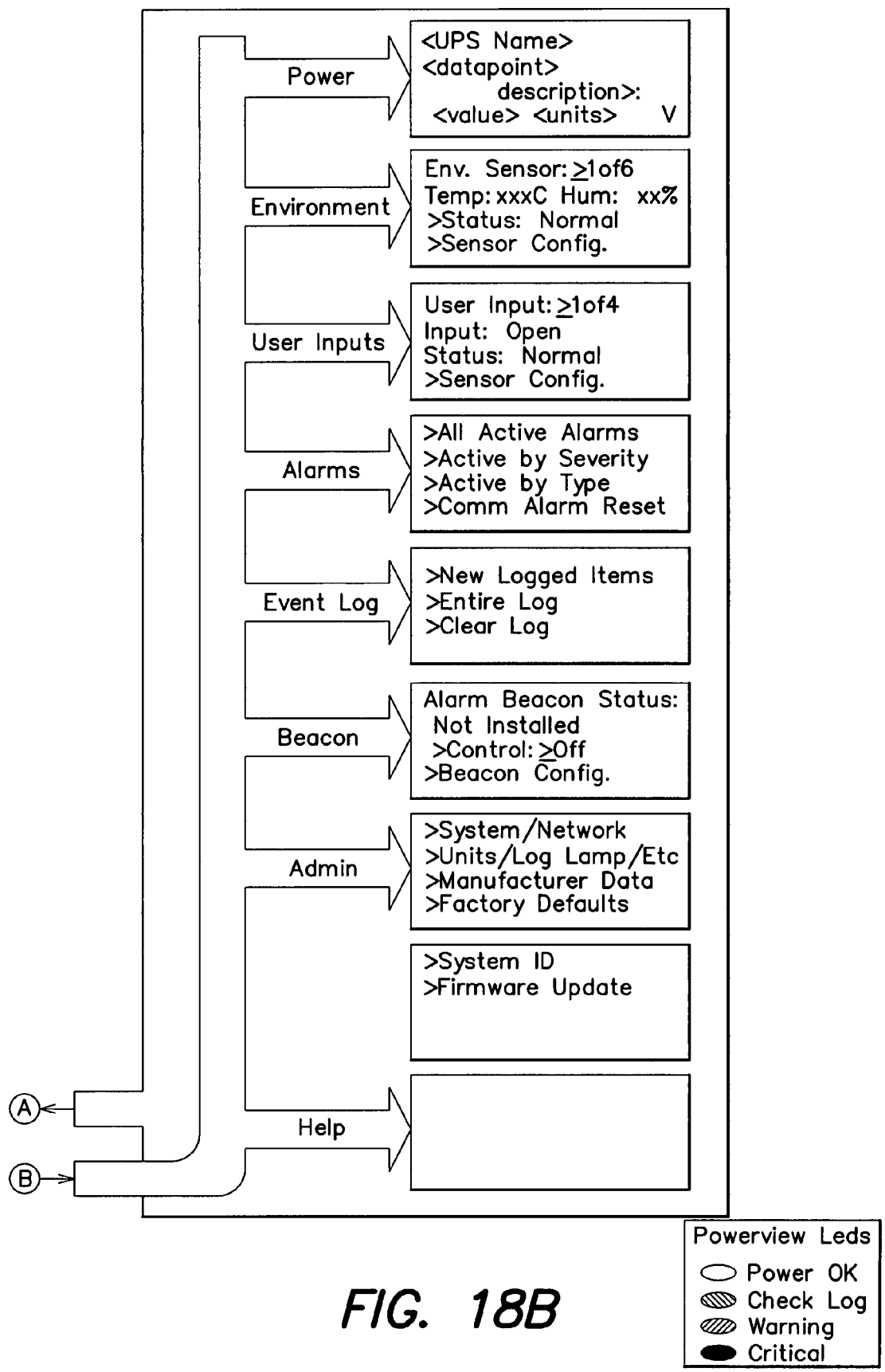

FIGS. 14-17 illustrate the display unit 104. As discussed above, the display unit 104 may be designed to be mounted on the front door 34 of the equipment storage rack 18, for example. The display unit 104 includes a front plate 160 and a display board 162 that fits within the front plate 160. As shown in FIG. 17, the display board 162 may be configured as an assembly, and includes a display screen 168 (e.g., a graphic user interface), indicator lights 170, and several control buttons 172. A back plate 164 (FIGS. 15 and 16) is provided to secure to the front plate 160 to hold the display unit 104 components together. Specifically, the front plate 160 and the display 162 are contoured to lie on the front door 34. The back plate 164 is provided to secure the front plate 160 and the display board 162 by means of several screw fasteners (not shown), which extend through perforations formed in the front door. A plug 166 (FIG. 17) is further provided to provide communication between the display unit 104 and the controller unit 102 via a cable (not shown) that runs within the interior region of the equipment storage rack 18.

Figure 14:
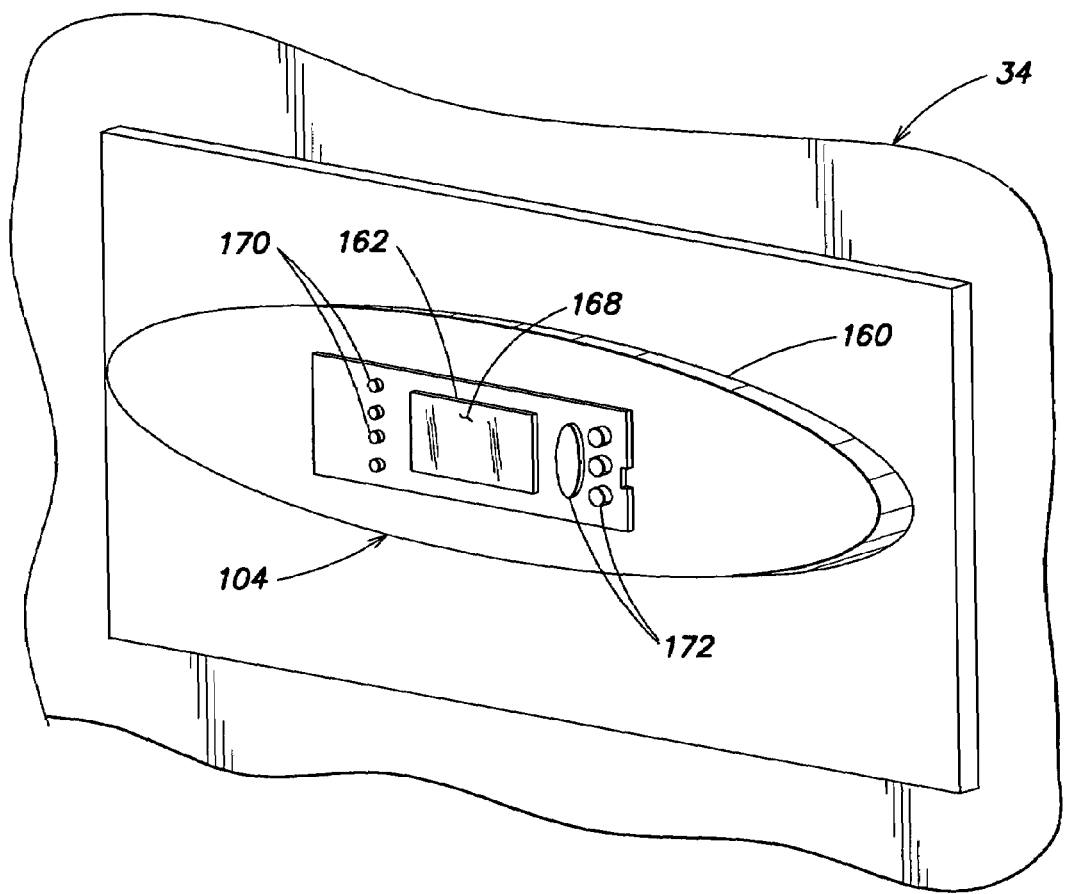
FIG. 14 is a front perspective view of a display unit of the management system, the display unit being mounted on a front door of an equipment storage rack.

The display unit 104 is designed to provide a small, single display on the front door 34 (or, depending on the configuration of the equipment storage rack 18, a rear door 58) of an equipment storage rack. The display unit 104 functions as a status panel, indicating at a glance that the equipment storage rack is functioning within acceptable limits or a problem is present. If a problem exists, the display unit 104 identifies the problem on the display screen 168. The display unit 104 may also function as a single network access point for remote monitoring and control. For example, the display unit 104 may be used to control the operation of the cooling system. As shown in FIGS. 14-16, the display unit 104 may be mounted onto an existing door, and thus may be used for retrofit situations.

The menu options available to an operator of the management system are illustrated in FIGS. 18-28. Specifically, FIGS. 18A and 18B show the menu structure for the rack manager system. As shown, the main menu includes prompts for selected sub-menus to control and monitor the following parameters: the delivery and status of power to the equipment storage rack; the control and status of environmental sensors; the control and status of selected user inputs; the status of the beacon; the control and status of other alarms, such as the door and motion sensors; an administrative control menu; a help menu; and a log of controller unit activity. From the main menu, the operator may select certain sub-menus to obtain information or to manipulate the settings of one or more of the sensors or related systems, e.g., the power or cooling systems. The "escape" key may be employed to back out of any selected menu.

Figure 19A:
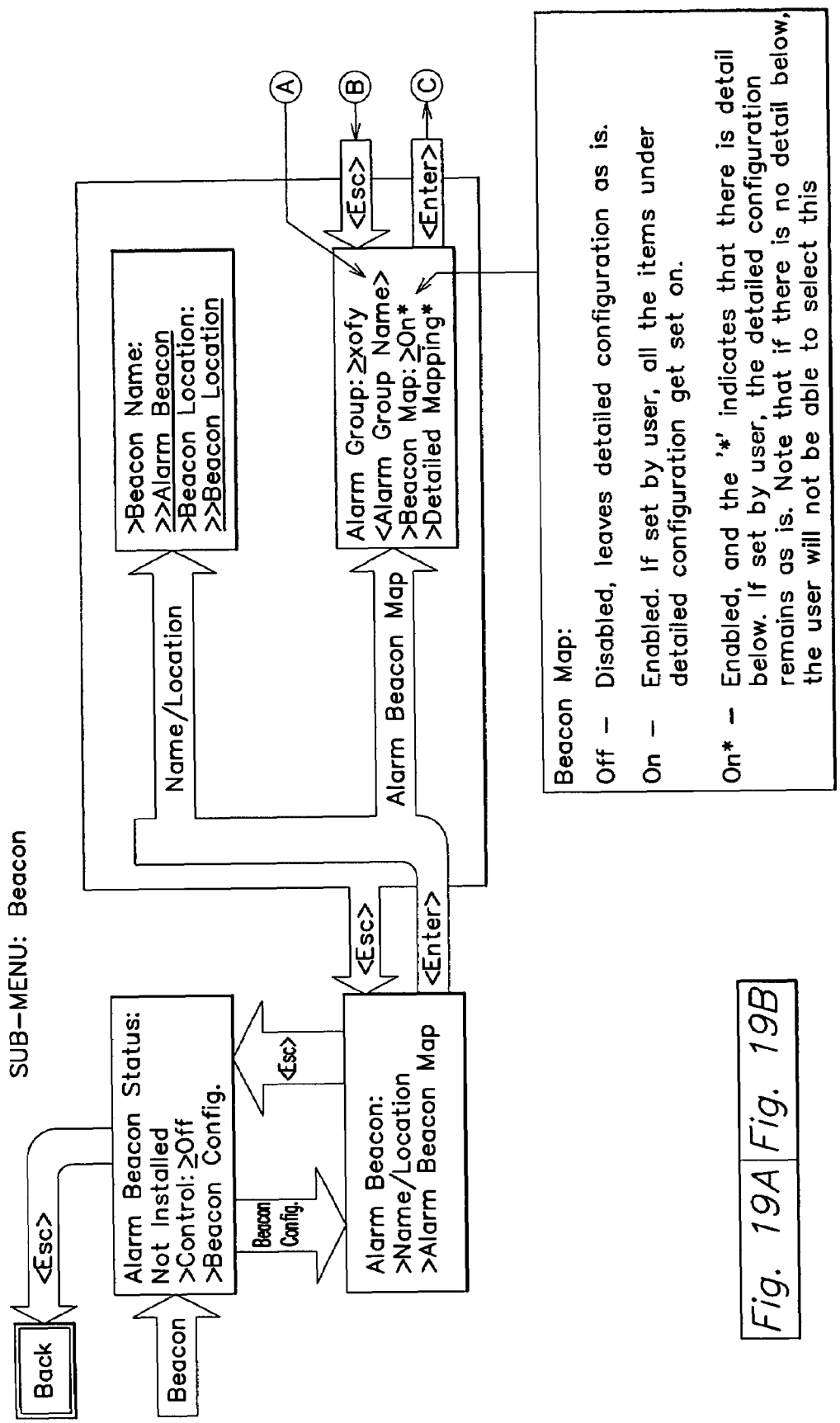
Figure 19B:
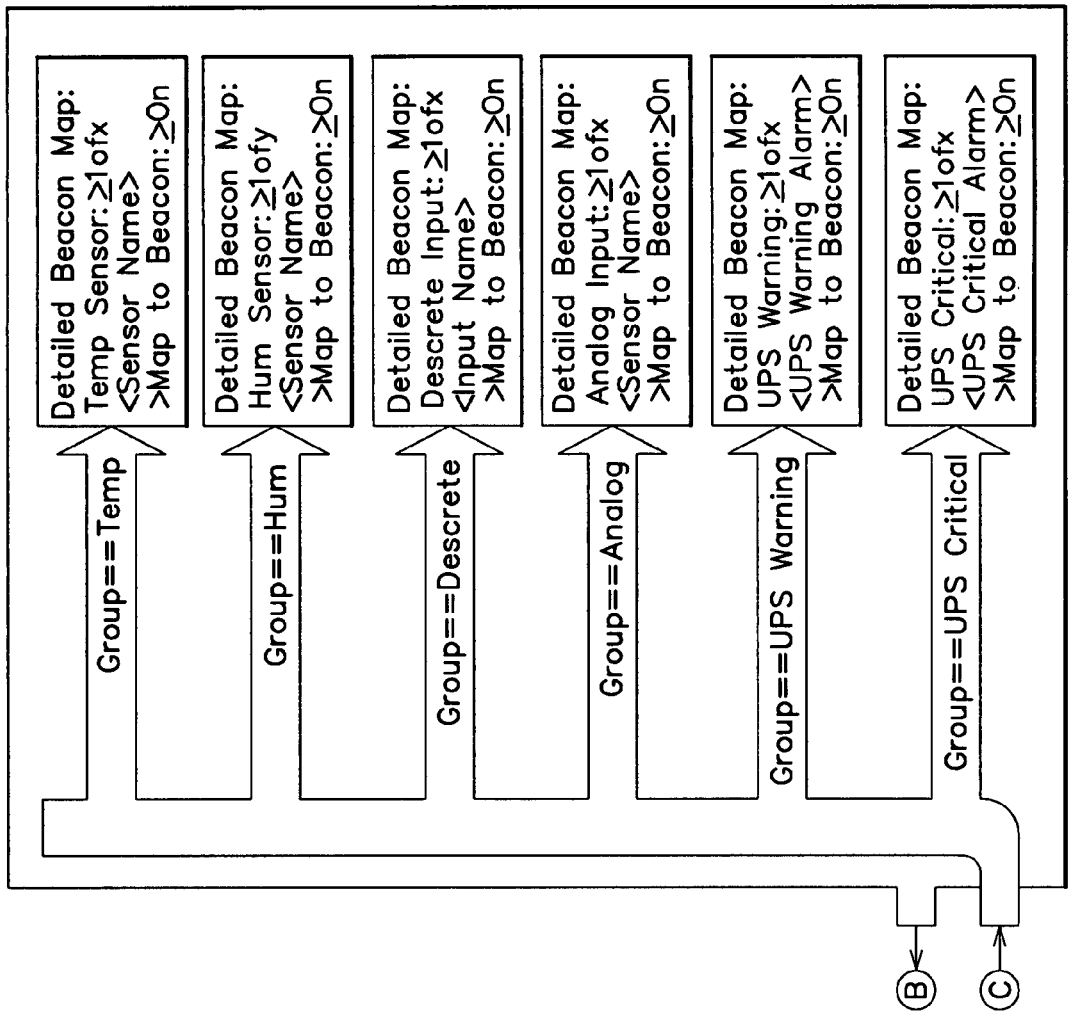
Figure 19B:
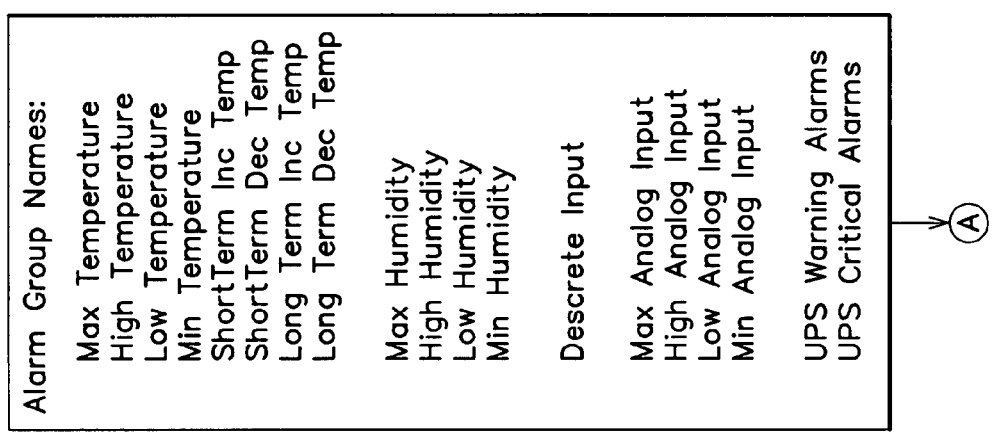

FIGS. 19A and 19B show the beacon sub-menu. With this particular sub-menu, the beacon may be programmed to activate upon the detection of certain events or occurrences. For example, the beacon (and an alarm) may be triggered when the temperature, as detected by the temperature sensor, exceeds a certain threshold. Other parameters may be similarly programmed with this sub-menu to create an alarm upon the occurrence of a certain event. Specifically, the operator enters the beacon map to set the parameters necessary to trigger or otherwise enable the beacon, such as the temperature sensor, the humidity sensor, the UPS warning and/or the UPS critical warning.

Figure 20:
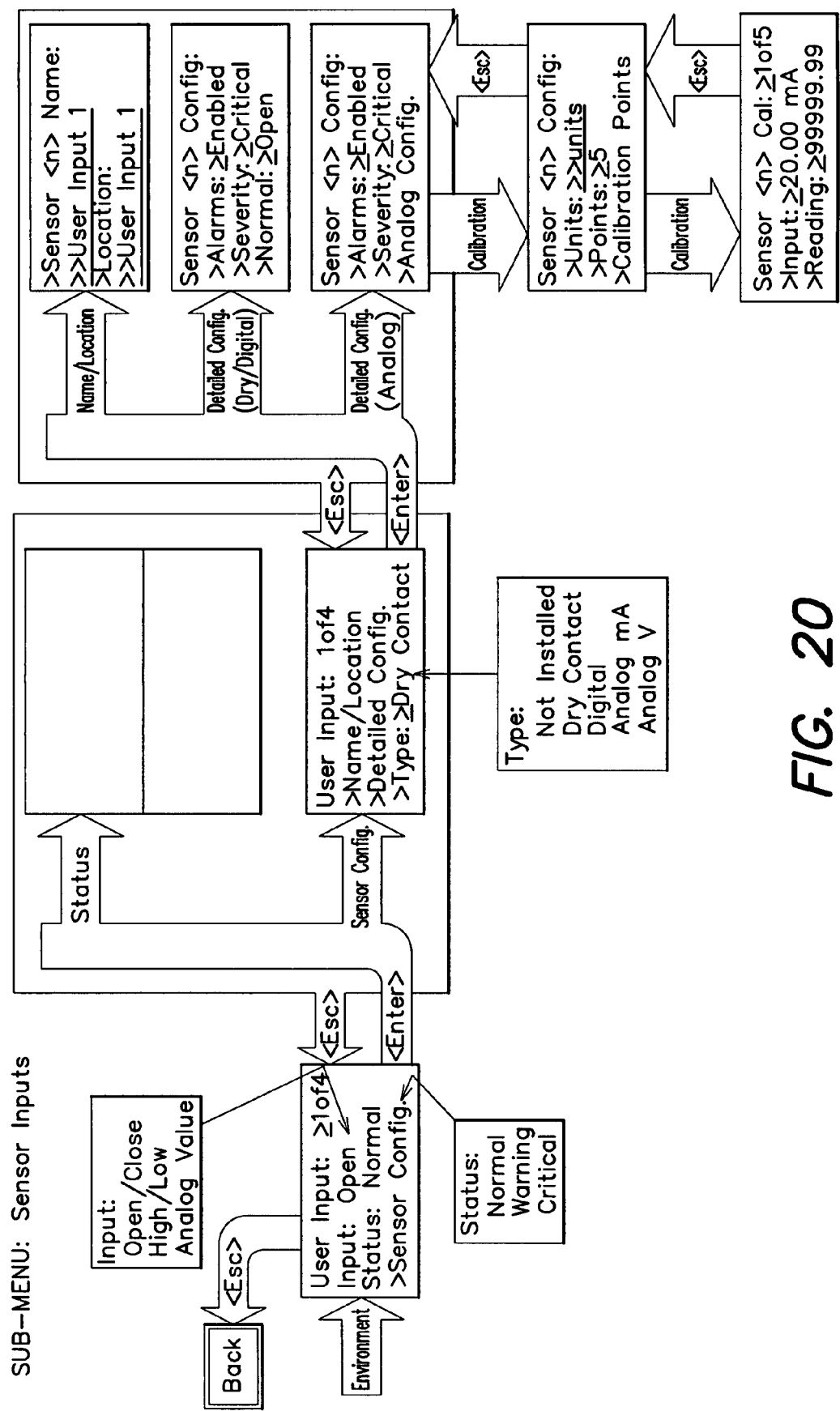

FIG. 20 shows the sensor inputs sub-menu. With this sub-menu, sensors not related to the environmental sensors, such as door and motion sensors, may be programmed by the operator. Control of environmental sensors may be achieved through the sub-menu shown and described in FIGS. 25A and 25B.

Figure 21:
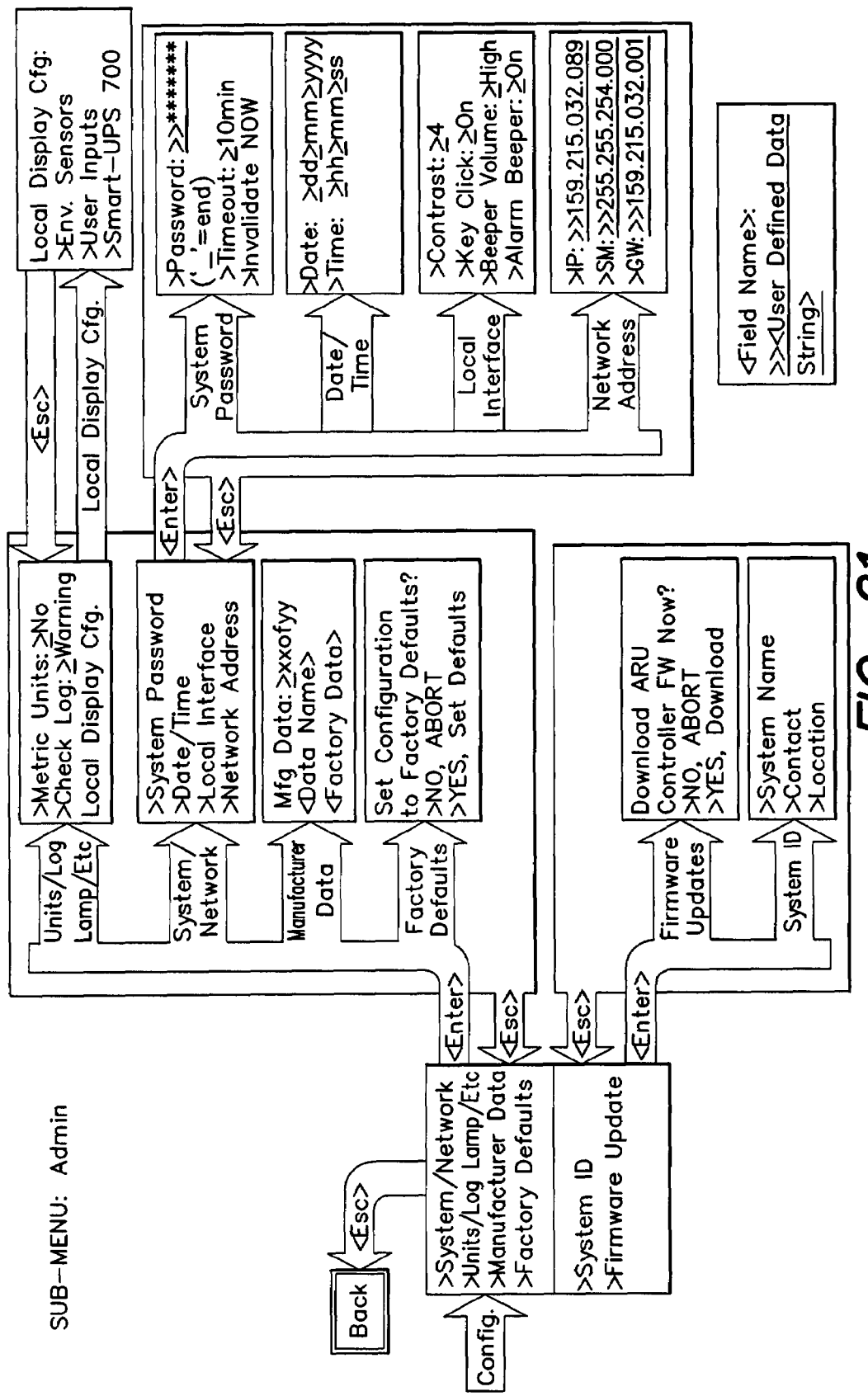

FIG. 21 shows the administrative sub-menu. As shown, administrative functions, such as setting a system password or configuring the various sub-menus, may be programmed by the operator into the controller unit via the display unit. For example, a user name or network address and an administrative password may be provided. Navigation may be achieved by using the "up," "down," "escape," "enter" and "help" keys.

Figure 22:
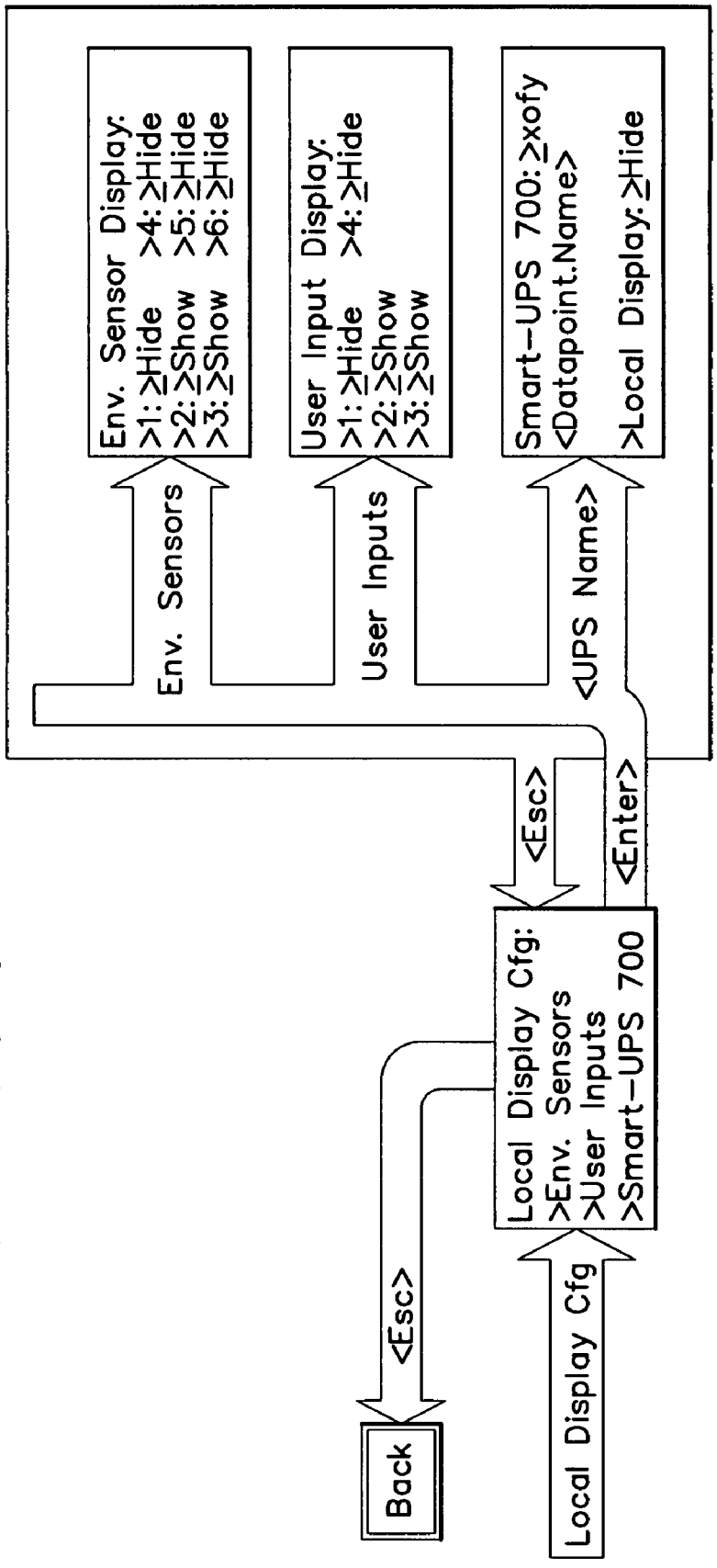

FIG. 22 shows the local display configuration sub-menu. The environmental sensors, user input displays (e.g., the motion detector) and UPS display conditions may be displayed on the display unit.

Figure 23:
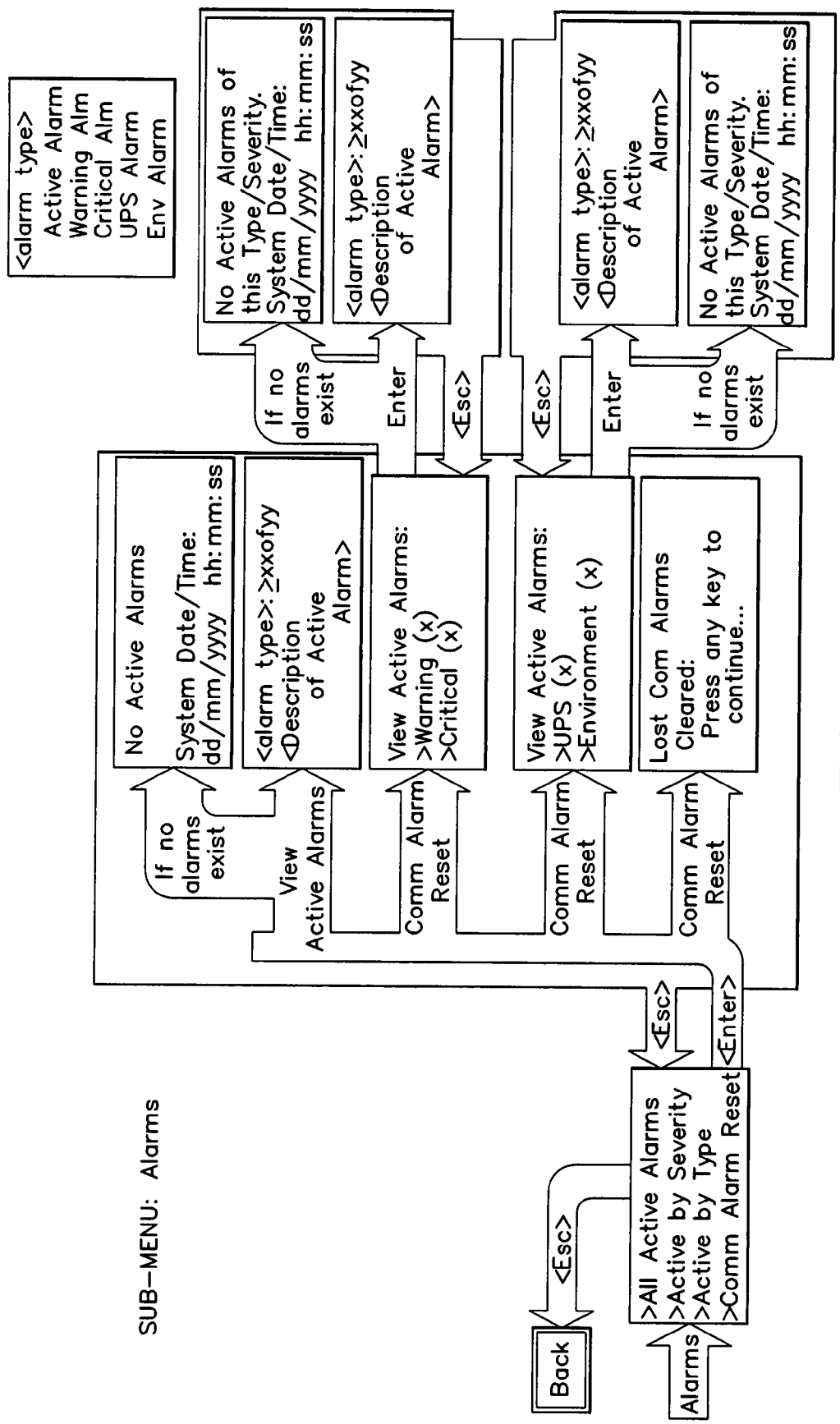

FIG. 23 shows the alarms sub-menu. With this particular sub-menu, the active alarms may be identified, programmed and viewed. As discussed above, in one embodiment, the controller unit may be programmed to recognize one of four levels of events, such as a major ($1^{st}$) event, a minor ($2^{nd}$) event, a warning ($3^{rd}$) event and an informational ($4^{th}$) event.

Figure 24:
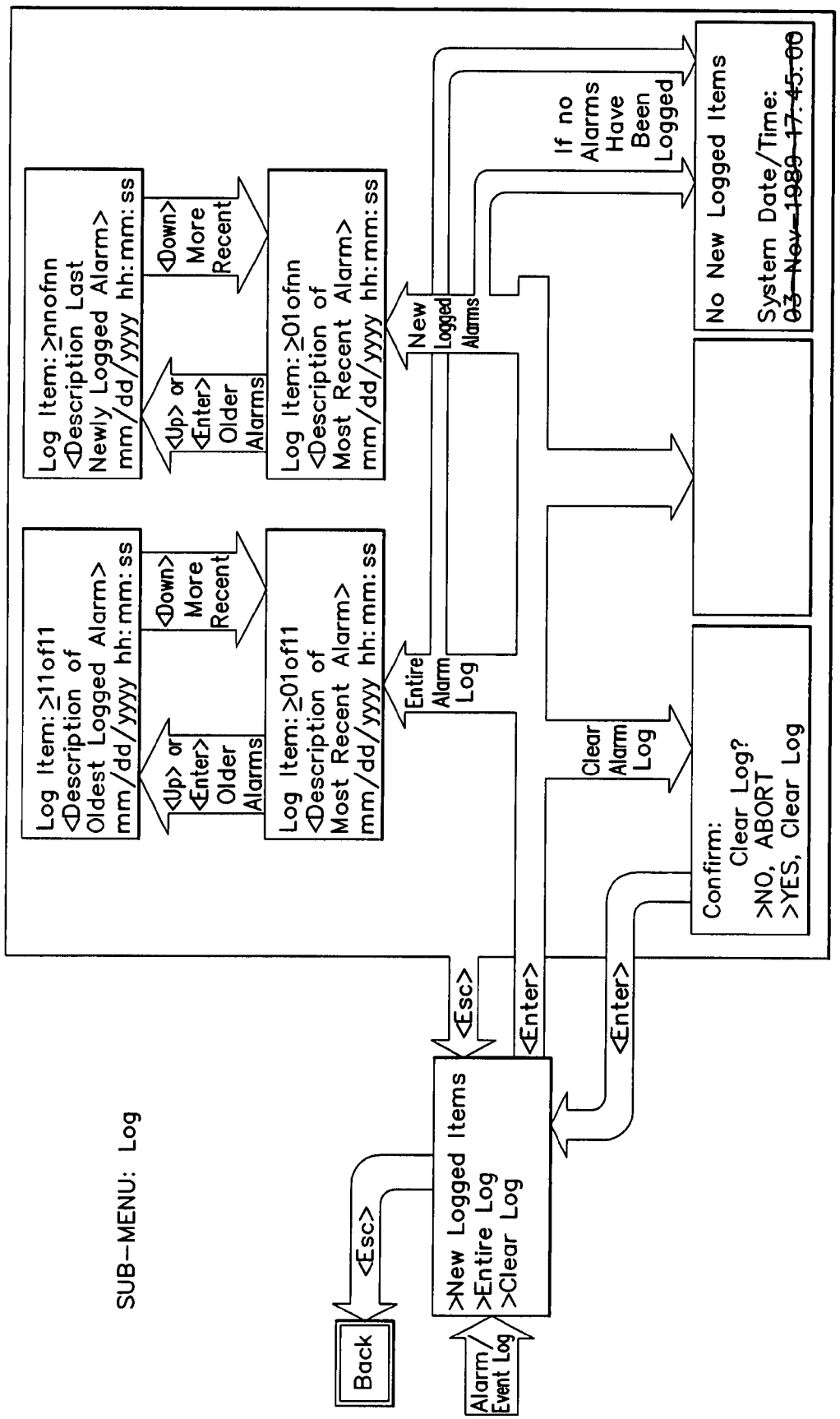

FIG. 24 shows the alarms log sub-menu, which may be configured to track the time, date and description, for example, of each alarm detection so that a log of the events is maintained.

Figure 25A:
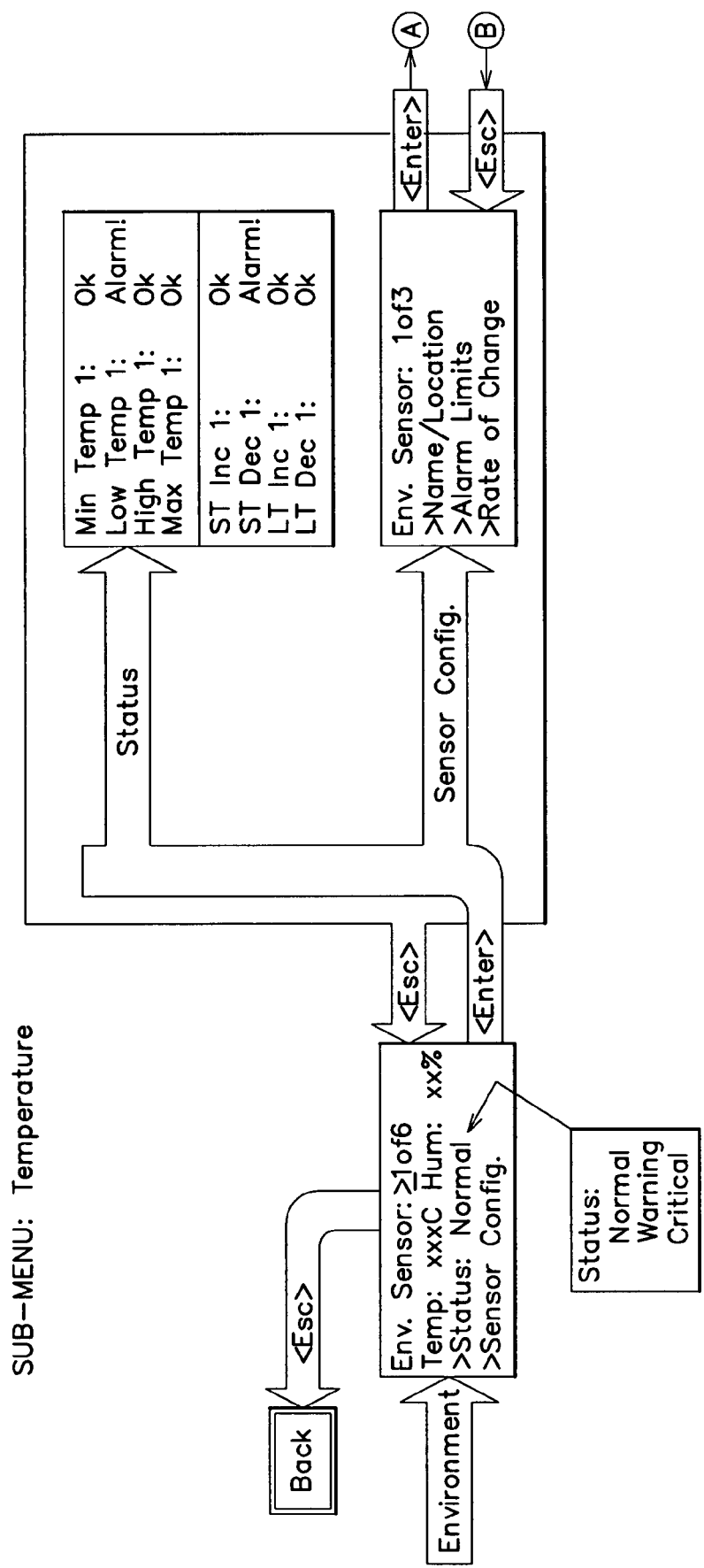
Figure 25B:
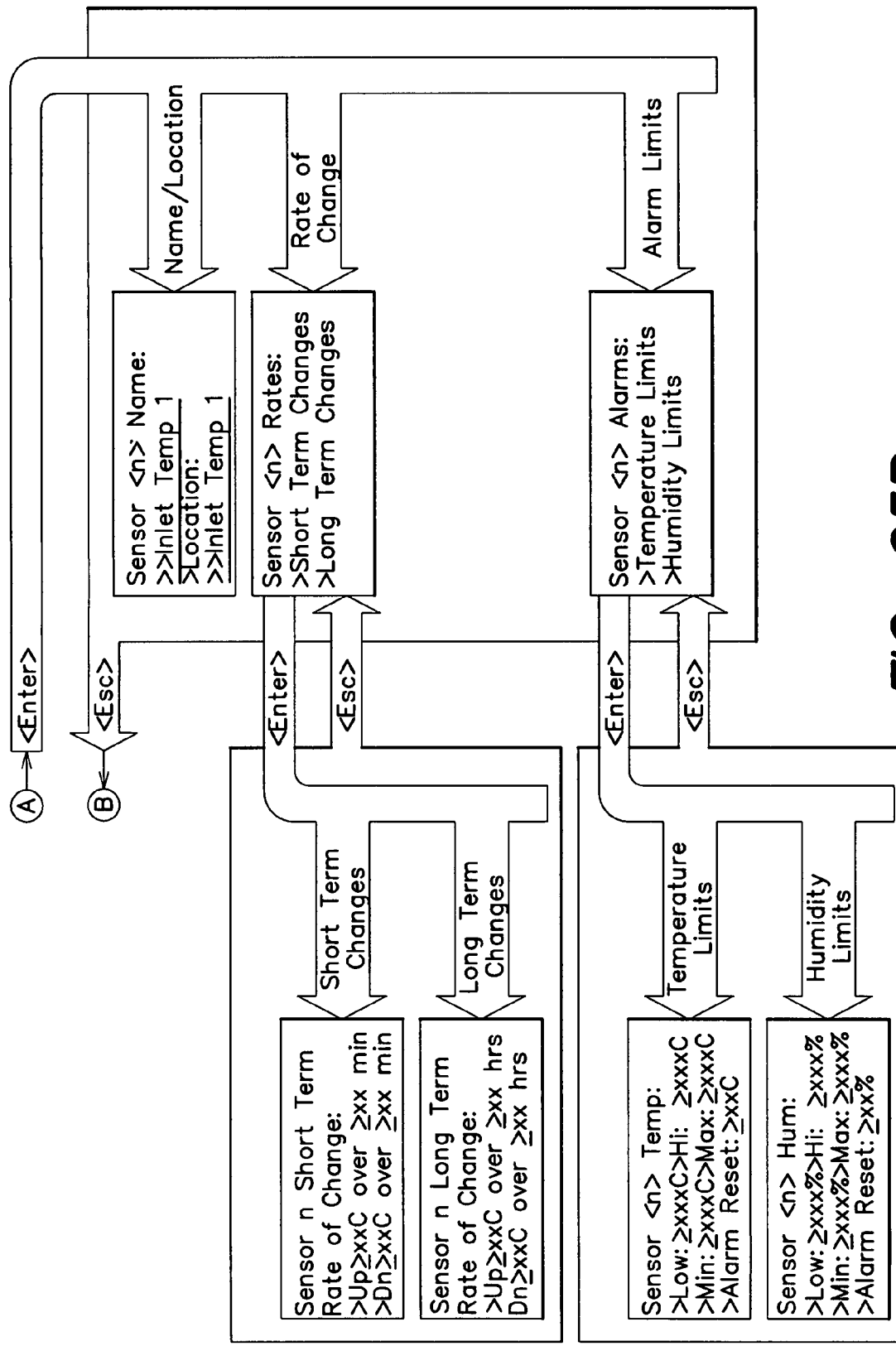

FIGS. 25A and 25B show the temperature sub-menu. As shown, the temperature sub-menu may be programmed so that the beacon and the alarm are triggered upon the temperature rising above or falling below predetermined maximum and minimum temperatures, respectively. Similarly, this sub-menu may be programmed to trigger alarms upon the humidity at the temperature/humidity sensor falling outside a predetermined range. In addition, rates of changes of temperature and humidity may also be programmed.

Figure 26A:
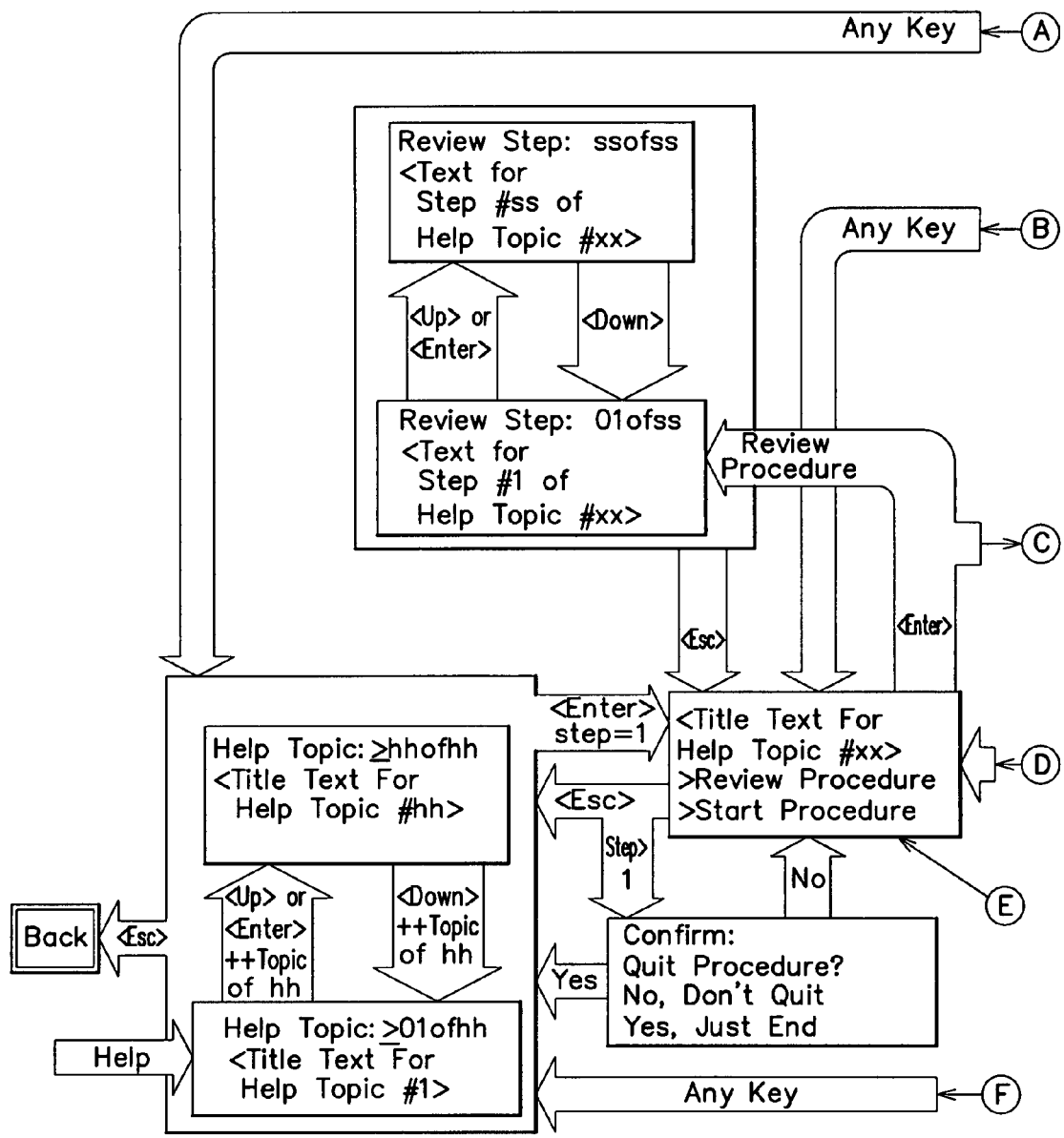
Figure 26B:
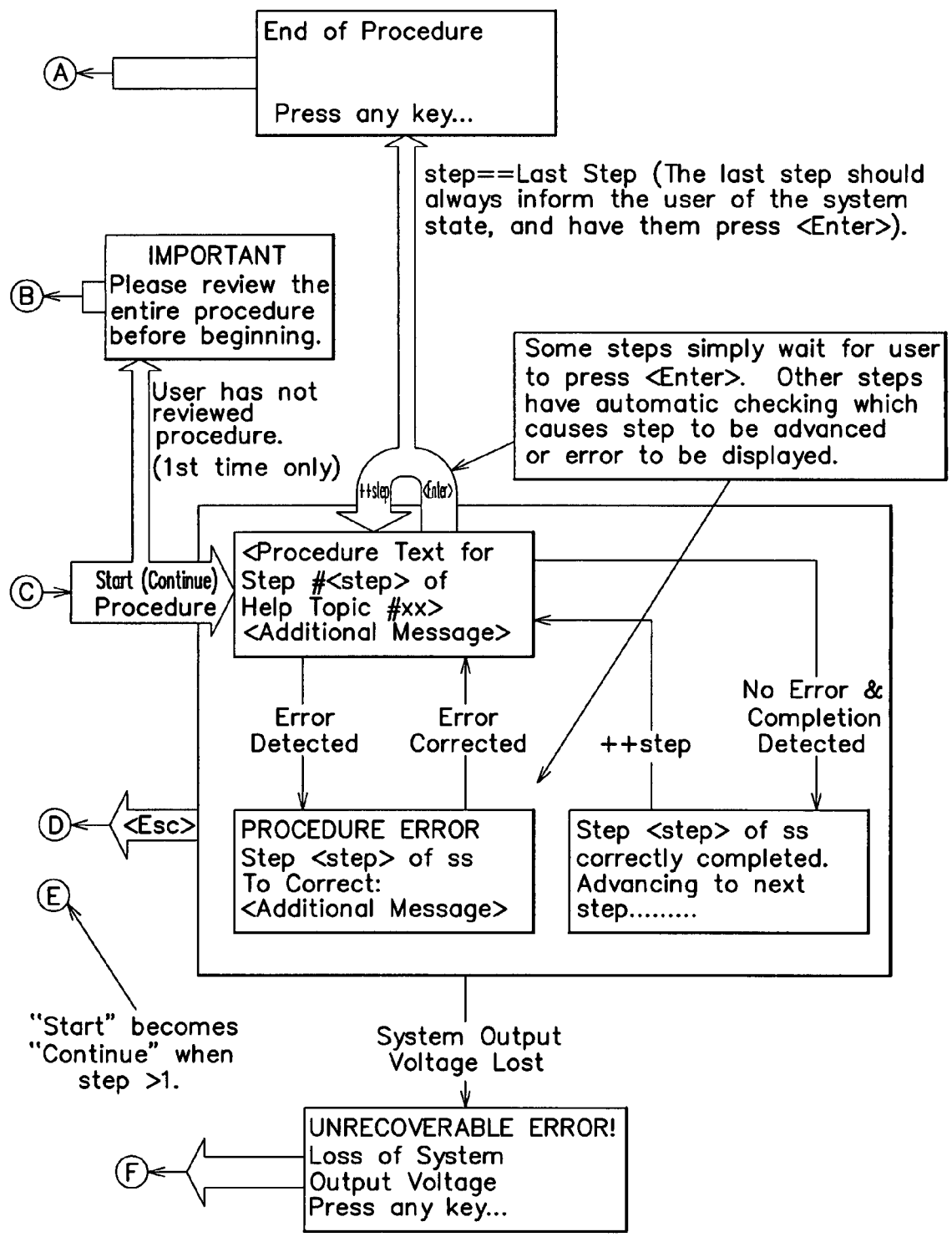

FIGS. 26A and 26B show the help menu, which provides assistance to the operator of the controller unit in programming the menu and sub-menus. As shown, help topics may be programmed into the menu to assist the operator in detecting and correcting errors during operation.

Figure 27:
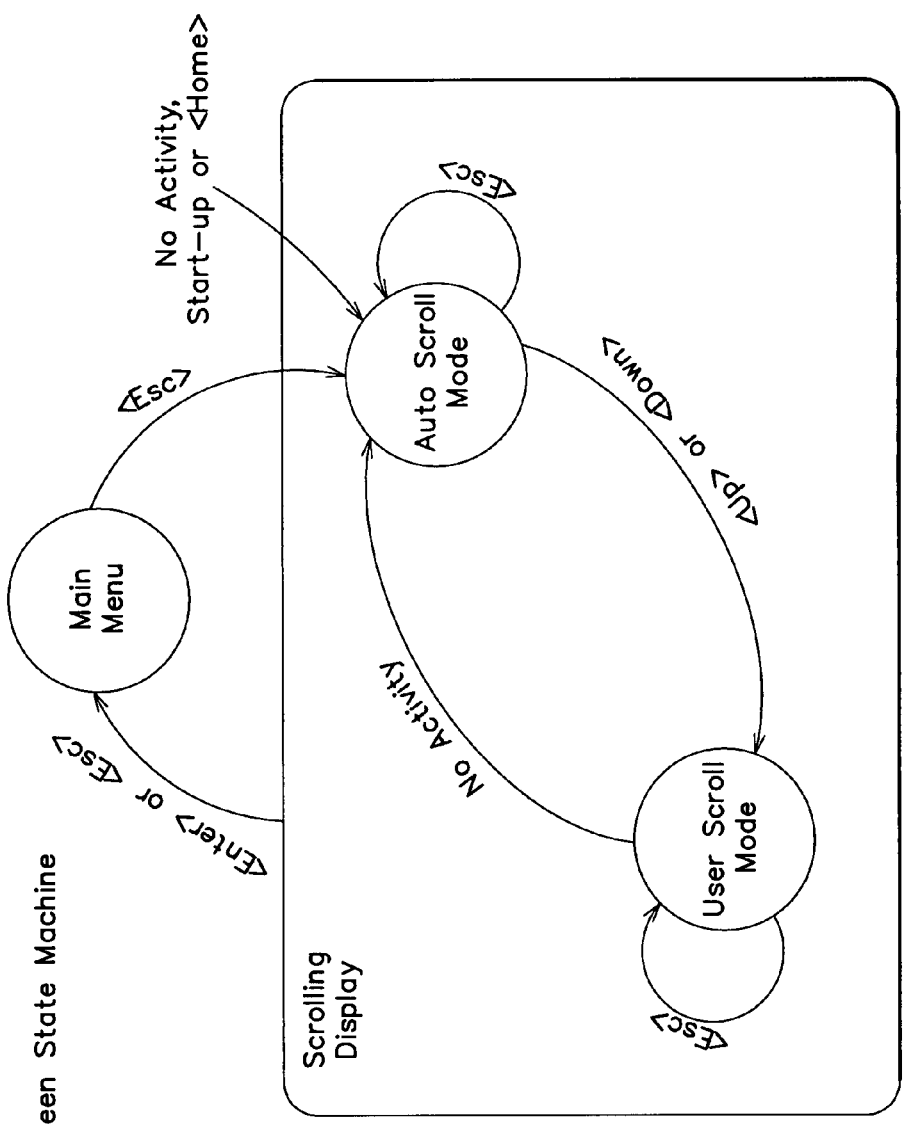

FIG. 27 shows a state diagram that describes the scrolling capability of the menu. When the display is scrolling, there are two modes of operation. In auto scroll mode, screens cycle from one screen to the next based on a timer. Pressing <up> or <down> buttons changes the user scroll mode. When in user scroll mode, screens cycle back and forward when the user presses the <up> or <down> buttons. Inactivity in the scroll mode may cause the user scroll mode to revert back to the auto scroll mode. As shown in FIG. 27, an operator may revert back to the main menu by pressing the <esc> button.

Figure 28A:
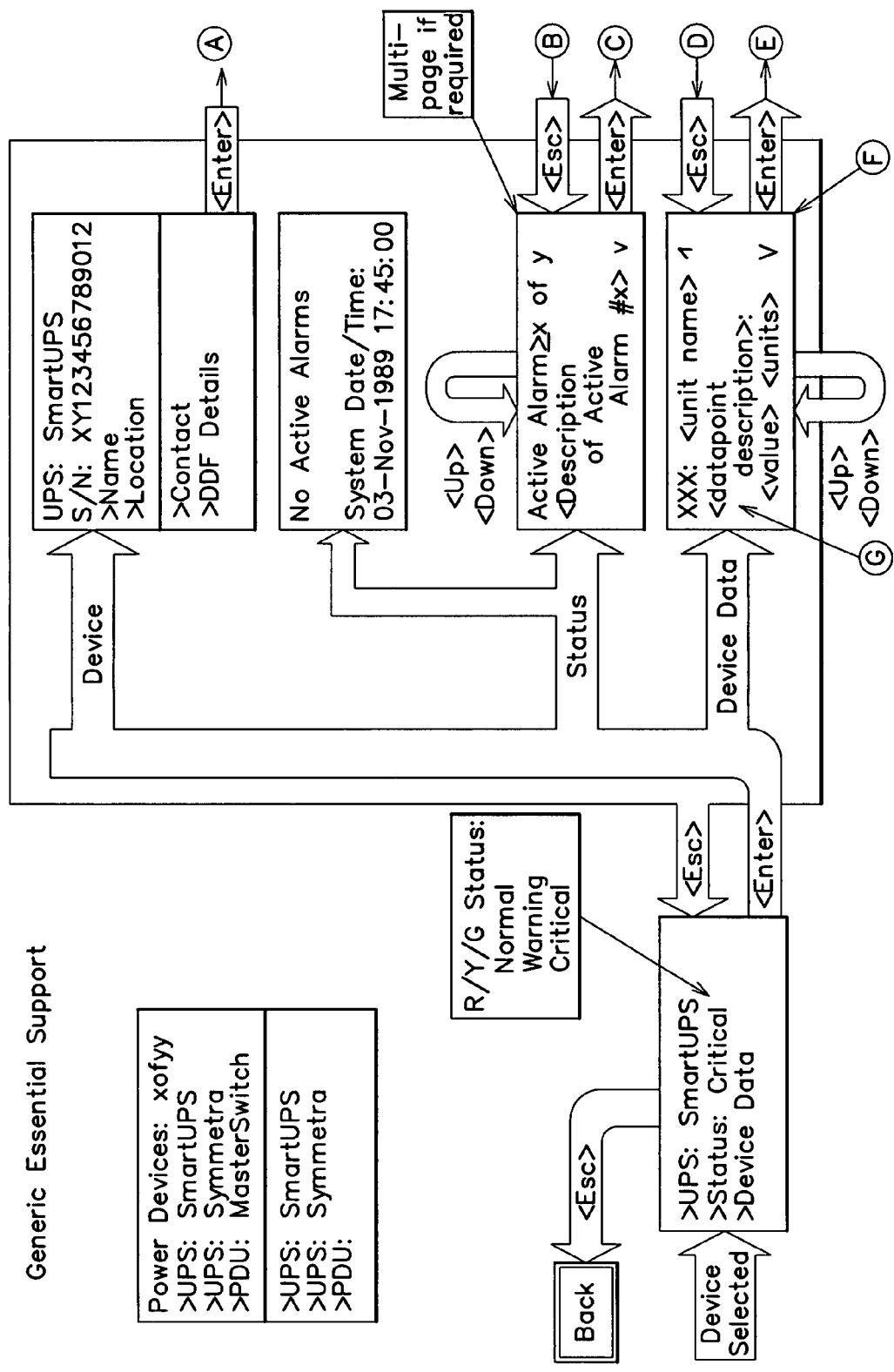
Figure 28B:
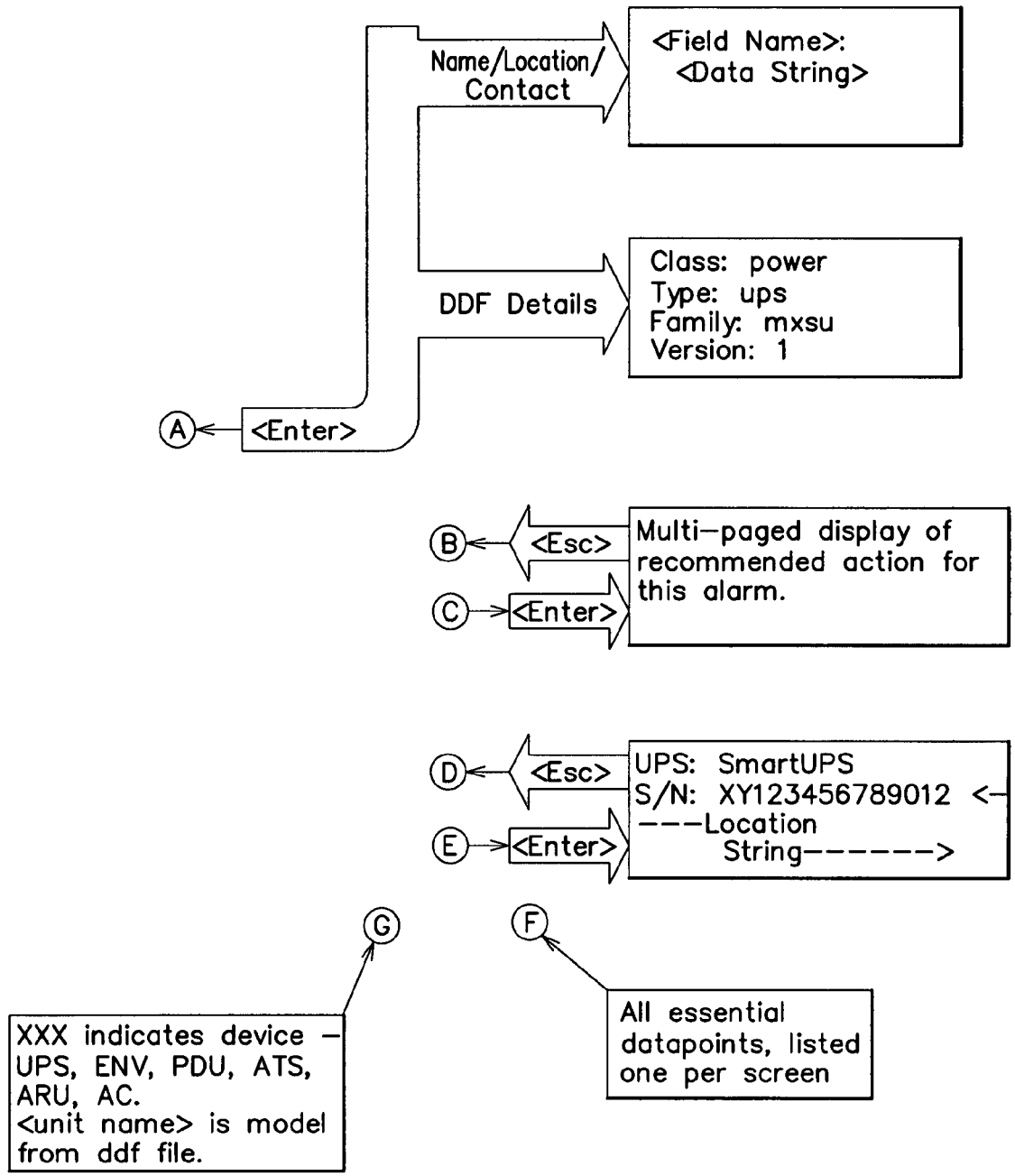

And finally, FIGS. 28A and 28B show generic essential support sub-menu for the main menu configuration.

Management systems of embodiments of the present invention may be particularly employed in configurations where it is desirable to network several equipment storage racks. With the display unit of the management system, the equipment operator need only view the display unit on each equipment storage rack to determine the present status of the equipment contained in the equipment storage rack. The management system offers a concise, local aggregation of device status and conspicuous indication of troubled conditions, if they occur. The management system is capable of retrofit applications, with the controller unit being mounted within the enclosure at the back of the enclosure and the display unit being mounted on the front door of the enclosure. Thus, the management system may be provided as a kit to the customer for such retrofit applications. In one embodiment, the kit may include one or more of the following items: a controller unit 102; a display unit 104; at least one monitoring device, including but not limited to a temperature sensor 116, a smoke sensor 120, a leak/moisture sensor 118, and a motion/vibration sensor 124; cable; a power device; and a beacon.

As discussed above, in one embodiment, the display screen of the display unit 104 includes a graphic user interface ("GUI"), which allows the equipment operator to control the operation of the equipment storage rack. The display unit 104 is configured to indicate if one or more problem exists and the equipment operator may scroll through a list of menus to identify and correct the particular problem. The equipment operator may also view key status parameters of monitored devices within the equipment storage rack 18 on the indicator lights 170. In one embodiment, the indicator lights 170 may inform the operator of the status of the power (e.g., with an indicator light showing "Power OK"), or the log (e.g., with an indicator light showing "Check Log"), or whether a problem exists (with an indicator light showing "Warning," "Critical").

Set up of the management system 100 is easy with the controller unit 102 being configured to discover certain devices connected to a local network. Specifically, the controller unit 102 is capable of identifying certain devices by a system of proprietary simple network management protocol ("SNMP") object identifier databases ("OIDs"), without prior knowledge of the particular device. Devices may be found on a local network by either scanning the local network for devices having a known or compatible address or by designing devices to perform a periodic broadcast of their presence. Third party devices may be supported by allowing the user to manually enter the address of the device. The summary of aggregated data is presented on both the local display and on the network via the Internet, SNMP, e-mail and Telnet, for example. This feature provides a remote operator with a single access point for summary data and detailed data via links directly to the equipment that is monitored. The system may also include one or more sensors to detect temperature, humidity, smoke, motion, vibration, and/or leak and moisture conditions. When such detections occur, a beacon, provided on top of the equipment storage rack, or on the outside of a wiring closet, for example, may be engaged. Various forms of the network notifications may be dispatched by the controller unit via e-mails and SNMP traps. Furthermore, the controller unit of at least some embodiments of the system may communicate serially to one or more UPS devices, thereby eliminating the cost and need of a network connection for low cost, entry level applications.

Thus, it should be observed that the management system 100 of embodiments of the present invention, including the controller and display units, as well as the monitoring devices, provide a small, concise and conspicuous indication of trouble via the display. The controller and display units may be easily mounted on the outside of an existing equipment storage rack. The management system 100 is capable of gathering data from multiple devices and of identifying trouble spots within the equipment storage rack. The management system is easy to install, and may be configured to operate either locally or from a remote location.

Having thus described at least one embodiment of the present invention, various alternations, modifications and improvements will readily occur to those skilled in the art. Such alterations, modifications and improvements are intended to be within the scope and spirit of the invention. Accordingly, the foregoing description is by way of example only and is not intended to be limiting. The invention's limit is defined only in the following claims and equivalents thereto.

What is claimed is:

1. An equipment storage rack comprising:
   a housing defining an interior region, the housing having a perforated panel;
   at least one piece of electronic equipment supported by the housing within the interior region; and
   a management system adapted to monitor and display conditions of the equipment storage rack, the management system comprising
      a controller unit mounted within the interior region of the housing, and
      a display unit coupled to the controller unit and mounted on the perforated panel of the housing, the display unit being of two-part construction, with a first part of the display unit being configured to be positioned on an outside of the perforated panel and a second part of the display unit being positioned on an inside of the perforated panel, the first and second parts being secured to one another without forming a dedicated opening in the perforated panel and with the perforated panel being disposed between the first and second parts.

2. The equipment storage rack of claim 1 further comprising at least monitoring device coupled with the controller to monitor at least one parameter of the equipment storage rack, wherein the at least one monitoring device includes an environmental sensor mounted on the housing of the equipment storage rack.

3. The equipment storage rack of claim 2, wherein the environmental sensor includes a temperature sensor, and wherein the equipment storage rack management system further comprises an air conditioning system coupled to the controller unit, the controller unit being configured to control the operation of the air conditioning system based on information obtained by the temperature sensor.

4. The equipment storage rack of claim 3, further comprising a sensor mount configured to be secured to the housing of the equipment storage rack and one of a snap-in clip and a zip-tie to attach the environmental sensor to the sensor mount.

5. The equipment storage rack of claim 4, wherein the environmental sensor includes a cable to connect the environmental sensor to the controller unit, and wherein the management system further comprises a cable mount configured to be secured to the housing of the equipment storage rack and one of a snap-in clip and a zip-tie to attach the cable to the cable mount.

6. The equipment storage rack of claim 2, further comprising a power device connected to the at least one piece of electronic equipment, and wherein the at least one monitoring device is connected to the power device.

7. The equipment storage rack of claim 1 wherein the perforated panel is part of a door to provide access to the interior region of the housing, and wherein the display unit is configured to mount on the door of the equipment storage rack.

8. The equipment storage rack of claim 1, further comprising a cable configured to connect the controller unit to a second controller unit of a second equipment storage rack.

9. The equipment storage rack of claim 1, further comprising a beacon, coupled to the controller unit and mounted on the housing of the equipment storage rack, to provide an alarm when the at least one monitoring device detects a predetermined event.

10. The equipment storage rack of claim 1, further configured to communicate with a network management system.

11. The equipment storage rack of claim 1, wherein the casing has mounting tabs configured to secure the controller unit to the housing of the equipment storage rack within the interior region of the housing of the equipment storage rack.

12. The equipment storage rack of claim 1, wherein the housing is configured as a standard nineteen inch rack.

13. A kit comprising:
a controller unit configured to be mounted within an equipment storage rack;
a display unit configured to be mounted on a perforated panel of the equipment storage rack, the display unit being of two-part construction, with a first part of the display unit being configured to be positioned on an outside of the perforated panel and a second part of the display unit being positioned on an inside of the perforated panel, the first and second parts being secured to one another without forming a dedicated opening in the perforated panel and with the perforated panel being disposed between the first and second parts; and
a cable to provide communication between the controller unit and the display unit.

14. The kit of claim 13, further comprising at least one monitoring device configured to monitor at least one parameter of the equipment storage rack and a cable to provide communication between the at least one monitoring device and the controller unit.

15. The kit of claim 14, wherein the at least one monitoring device includes at least one environmental sensor.

16. The kit of claim 14, wherein the at least one monitoring device is connected to a power device.

17. The kit of claim 14, wherein another cable further provides communication between the controller unit and a second controller unit of a second equipment storage rack.

18. The kit of claim 14, further comprising a beacon, configured to be coupled to the controller unit and mounted on a housing of the equipment storage rack by another cable, to provide an alarm when the at least one monitoring device detects a predetermined event.

19. The kit of claim 14, wherein the controller unit is configured to communicate with a network management system.

20. The kit of claim 14, wherein the controller unit comprises a casing having mounting tabs configured to secure the controller unit to the housing of the equipment storage rack within an interior region of the housing of the equipment storage rack.

21. The kit of claim 14, further comprising a cooling system configured to be coupled to the controller unit by another cable.

22. A method of controlling an equipment storage rack of the type comprising at least one piece of electronic equipment, the method comprising:
mounting a controller unit on the equipment storage rack;
mounting a display unit on a perforated panel of the equipment storage rack, wherein the display unit is of two-part construction, with a first part of the display unit being configured to be positioned on an outside of the perforated panel and a second part of the display unit being positioned on an inside of the perforated panel, the first and second parts being secured to one another without forming a dedicated opening in the perforated panel and with the perforated panel being disposed between the first and second parts;
mounting at least one monitoring device configured to monitor at least one parameter of the equipment storage rack; and
connecting the controller unit to the display unit and the at least one monitoring device.

23. The method of claim 22, further comprising connecting the controller unit with an uninterrupted power supply of the equipment storage rack.

24. The method of claim 22, wherein the at least one monitoring device includes an environmental sensor.

25. The method of claim 22, wherein the environmental sensor includes one of a temperature sensor and a combination temperature and humidity sensor, and wherein the method further comprises connecting a cooling system to the controller unit, the controller unit being configured to control the operation of the cooling system based on information obtained by the temperature sensor.

26. The method of claim 22, wherein mounting the at least one monitoring device includes securing a sensor mount to the housing of the equipment storage rack and attaching the at least one monitoring device to the sensor mount with one of a snap-in clip and a zip-tie.

27. The method of claim 22, wherein connecting the controller unit to the at least one monitoring device includes employing a cable, and further comprising securing a cable mount to the housing of the equipment storage rack and attaching the cable to the cable mount with a zip-tie.

28. The equipment storage rack of claim 1, wherein the casing has a widthwise dimension of seventeen inches.

29. An equipment storage rack comprising:
a housing defining an interior region, the housing having a perforated panel;
at least one piece of electronic equipment supported by the housing within the interior region; and
a management system adapted to monitor and display conditions of the equipment storage rack, the management system comprising a controller unit and a display unit coupled to the controller unit and mounted on the perforated panel of the housing, the display unit being of two-part construction, with a first part of the display unit being configured to be positioned on an outside of the perforated panel and a second part of the display unit being positioned on an inside of the perforated panel, the first and second parts being secured to one another without forming a dedicated opening in the perforated panel and with the perforated panel being disposed between the first and second parts.

* * * * *